United States Patent
Sugai

(10) Patent No.: US 6,751,566 B2
(45) Date of Patent: Jun. 15, 2004

(54) SAMPLING DIGITIZER, METHOD FOR SAMPLING DIGITIZING, AND SEMICONDUCTOR INTEGRATED CIRCUIT TEST DEVICE WITH SAMPLING DIGITIZER

(75) Inventor: Masao Sugai, Tokyo (JP)

(73) Assignee: Advantest Corporation, Tokyo (JP)

( * ) Notice: Subject to any disclaimer, the term of this patent is extended or adjusted under 35 U.S.C. 154(b) by 232 days.

(21) Appl. No.: 10/048,721

(22) PCT Filed: May 29, 2001

(86) PCT No.: PCT/JP01/04480

§ 371 (c)(1), (2), (4) Date: Jan. 29, 2002

(87) PCT Pub. No.: WO01/92899

PCT Pub. Date: Dec. 6, 2001

(65) Prior Publication Data

US 2002/0107670 A1 Aug. 8, 2002

(30) Foreign Application Priority Data

May 29, 2000 (JP) .......................................... 2000-158259
Jun. 2, 2000 (JP) .......................................... 2000-265691

(51) Int. Cl.[7] .......................... G06F 19/00; G01R 13/14

(52) U.S. Cl. .......................... 702/70; 702/66; 324/76.15
(58) Field of Search .............................. 702/70, 66, 57; 324/76.11, 76.12, 76.13, 76.15; 327/91, 94

(56) References Cited

U.S. PATENT DOCUMENTS 5,708,432 A * 1/1998 Reynolds et al. ............ 341/123

FOREIGN PATENT DOCUMENTS

JP           563128        8/1993

* cited by examiner

*Primary Examiner*—John Barlow
*Assistant Examiner*—Meagan S. Walling
(74) *Attorney, Agent, or Firm*—David N. Lathrop, Esq.; Gallagher & Lathrop

(57) ABSTRACT

A sampling digitizer comprises a sampling head 11, a clock generator 12, a digitizer 13 and a trigger circuit 14. A clock signal from the clock generator is also supplied to a delay element 15, and a change-over switch 16 switches from an output from the delay element 15 to a clock signal which does not pass through the delay element 15 to feed the sampling head 11 in response to a trigger signal from the trigger circuit.

21 Claims, 18 Drawing Sheets

SAMPLING DIGITIZER, METHOD FOR SAMPLING DIGITIZING, AND SEMICONDUCTOR INTEGRATED CIRCUIT TEST DEVICE WITH SAMPLING DIGITIZER

TECHNICAL FIELD

The present invention relates to an apparatus for sampling a fast rate repeated waveform with a slower rate clock to convert it into a low rate waveform for purpose of observation, measurement and analysis (such apparatus will be hereafter referred to as "sampling digitizer"), such a method and a semiconductor integrated circuit testing equipment provided with a sampling digitizer.

BACKGROUND OF THE INVENTION

As is well known in the art, a sampling digitizer, comprises a sampling head 11, a clock generator 12, an apparatus (hereafter referred to as "digitizer section") 13 which observes, measures and/or analyzes a signal waveform, and a trigger circuit 14, as illustrated in FIG. 1. The sampling digitizer converts a high rate repeated signal (waveform) HRS input to the sampling head 11 (usually formed by a circuit including a diode bridge) into a low rate repeated signal (waveform) by an equivalent sampling technique to be described later, and performs an observation, measurement and analysis of the input waveform of the high rate repeated signal HRS by observing, measuring and analyzing the waveform of the low rate repeated signal.

The equivalent sampling technique is illustrated in FIG. 2A for a high rate repeated signal HRS having a period T and input to the sampling head 11, as an example. In this instance, the clocking generator 12 generates a clock signal CLK1 and supplies it to the sampling head 11 at a given sampling rate (period) T1 equal to (nT+Δt) such that sample timings t1, t2, t2, . . . for the repeated signal HRS be sequentially offset in their phases within the period T by a minimal time interval Δt which corresponds to a constant phase (in the example shown, the phase of the sample timings is sequentially lagging by Δt). The given minimal interval Δt by which the phase of the sample timing is sequentially offset in the period T is referred to in the art as "equivalent sampling interval". When the frequency of a clock signal CLK having a period equal to a time interval nT obtained by subtracting the equivalent sampling interval from the period T1 is denoted by F, n is equal to the quotient of dividing the frequency of the high rate repeated signal HRS by the frequency F of the clock signal CLK. Usually, the frequency F of the clock signal CLK is chosen relative to the frequency of the high rate repeated signal HRS so that the quotient n is an integer.

As a consequence of this, the sampling head 11 delivers a low rate data signal OUT1 at the sampling rate T1. As shown in FIG. 2C, the low rate data signal OUT1 appears as converted into a waveform data train a, b, c, . . . in which the amplitude level changes stepwise in alignment with sample timings t1, t2, t3, . . . Waveform data train a, b, c, . . . is downloaded into the digitizer section 13, and when it is superimposed every period nT, the waveform data a, b, c, . . . are plotted at a time interval of the equivalent sampling interval Δt. Accordingly, as shown in FIG. 2D, there is obtained a low rate repeated signal LRS1 having a period T3 which is equal to the sampling rate T1 multiplied by the number of samples per period T of the high rate repeated signal HRS. It follows that the waveform of the low rate repeated signal LRS1 is substantially identical with the waveform of the high rate repeated signal HRS.

It is to be noted that in order to facilitate the understanding of the equivalent sampling technique, the waveform of the high rate repeated signal HRS is shown enlarged and the equivalent sampling interval Δt is shown lengthened in FIG. 2. Thus, in FIG. 2, n=3 and the sampling rate T1=3T+Δt. However, the high rate repeated signal HRS generally has a frequency which is much greater than the frequency F of the clock signal CLK, and accordingly, n assumes a significantly higher value.

Describing this in terms of specific figures, the high rate repeated signal HRS may have a frequency of 1 GHz (or its period is 1 ns) while the internal clock signal CLK of the clock generator 12 may have a frequency F of 100 kHz. Assuming in this instance that the number of samples per period T (1 ns) of the high rate repeated signal HRS is equal to 100 (thus acquiring 100 data items per period T while sequentially delaying the phase of the sample timing by the equivalent sampling interval Δt), it follows that adjacent two sample points are spaced apart by 1 ns/100=10 ps, which is the equivalent sampling interval Δt. Consequently, the clock generator 12 generates and delivers to the sampling head 11 the clock signal CLK1 at the sampling rate T1=1 ns×(1 GHz/100 kHz)+10 ps=10 μs+10 ps. The sampling head 11 delivers the waveform data train a, b, c, . . . in which the amplitude level changes stepwise at sample timings t1, t2, t3, . . . at the sampling rate T1=10 μs+10 ps. Such waveform data is downloaded into the digitizer section 13. When downloaded waveform data is synthesized at a time interval between the sample timings or the equivalent sampling interval of 10 ps (or Δt), there is obtained the low rate repeated signal LRS1 having a period T3 corresponding to (10 μs+10 ps)×100 as shown in FIG. 2D.

The trigger circuit 14 has the function of establishing a start point of observation, measurement and/or analysis of the waveform of the high rate repeated signal HRS. Specifically, information relating to a start point of observation, measurement and/or analysis of the waveform such as a level, a rising edge, a falling edge or the like (hereafter referred to as "trigger information") is preset in the trigger circuit 14. When trigger information contained in the data signal OUT1 (waveform data train a, b, c, . . .) which is fed from the sampling head 11 to the trigger circuit 14 matches the trigger information which is preset in the trigger circuit 14, the latter produces a trigger signal TR, which is applied to the digitizer section 13. The digitizer section 13 initiates downloading the waveform data train from the time the trigger signal is applied thereto. Thus from the time (hereafter referred to as "trigger point") the trigger circuit 14 produces the trigger signal TR, the observation, measurement, analysis and the like of the waveform of the high rate repeated signal HRS is initiated using the low rate repeated signal LRS1. Instead of directly feeding the sampled output of the sampling head 11 to the digitizer section 13 and the trigger circuit 14, the output may be converted into digital values by an A/D converter, not shown, before being fed to the digitizer section 13 and the trigger circuit 14. Thus, it should be understood that the output data signal from the sampling head 11 may comprise the original sampled signal or the converted digital signal as the case may be in the description to follow.

As described, with a conventional sampling digitizer, because the start point of the observation, measurement, analysis and the like is defined by the trigger point, the observation, measurement, analysis and the like of the waveform is limited to a portion thereof which occurs after the trigger point as a matter of course. If the trigger point is represented by a point a in the waveform shown in FIG. 2D, for example, no observation, measurement, analysis and the like of a waveform portion which precedes point a in time (or located to the left thereof as viewed in FIG. 2D) is allowed.

A waveform region of a high rate repeated signal HRS for which an observation, measurement, and/or analysis is desired is generally a fraction of one period T of the high rate repeated signal HRS, which is frequently a rising edge region of the waveform as an example. As described above, because the trigger point defines the start point of the observation, measurement, analysis and the like of the waveform, supposing that point a in the waveform of FIG. 2A defines the trigger point, the trigger circuit 14 does not generate the trigger signal TR until the waveform data a shown in FIG. 2C is delivered from the sampling head 11 and is input to the trigger circuit 14, thus preventing the observation, measurement, analysis and the like of the waveform portion which occurs at and subsequent to the trigger point, as desired.

An N-channel sampling digitizer as shown in FIG. 3 (where N is an integer equal to or greater than 2) is also used in the prior art. It comprises a plurality of sampling heads 11 and a plurality of digitizer sections 13, each operating according to the described equivalent sampling technique to convert a high rate repeated signal into a low rate repeated signal, thus enabling a simultaneous observation, measurement, and analysis and the like of the converted signal waveforms by the plurality of digitizer sections.

In the example shown in FIG. 3, a plurality of high rate repeated signals HRS1, HRS2, . . . HRSN of a substantially equal phase are input to associated sampling heads 11-1, 11-2, . . . 11-N, respectively, which are simultaneously fed with a clock signal CLK1 from a common clock generator 12 at a given sampling rate, which may be the sampling rate T1 shown in FIG. 2B, for example. In response thereto, the sampling heads 11-1 to 11-N deliver low rate data signals OUT1, OUT2, . . . OUTN, respectively, each comprising a waveform data train as converted in which the amplitude level changes stepwise at the sample timings.

By way of example, when high rate repeated signals HRS1, HRS2, . . . , HRSN which rise substantially simultaneously are input to a plurality of sampling heads 11-1, 11-2, . . . , 11-N, and a common clock generator 12 generates a clock signal CLK1 at a constant sampling rate T1 such that the phase of sample timings for the repeated signals HRS1 to HSN are sequentially offset by an equivalent sampling interval Δt (for example, the phase of the sample timing is sequentially delayed by Δt), the sampling heads 11-1 to 11-N deliver low rate data signals OUT1 to OUTN in which the amplitude level changes stepwise at the sample timings in the similar manner as shown in FIG. 2C for the low rate data signal OUT1 at the sampling rate T1.

Only one trigger circuit 14 is provided for the plurality of digitizer sections 13-1, 13-2, . . . , 13-N in common, and data signal OUT from any one of the plurality of sampling heads 11-1 to 11-N, which is data signal OUTN from the N-th sampling head 11-N in this example, is fed as an input signal to the trigger circuit 14. Obviously, data signal from any other sampling head may be fed as an input signal to the trigger circuit 14.

In response to a trigger signal TR applied from the common trigger circuit 14, the plurality of digitizer sections 13-1, 13-2, . . . , 13-N initiate downloading the data signals OUT1, OUT2, . . . , OUTN fed from the associated sampling heads 11-1, 11-2, . . . , 11-N. Assuming that the trigger point represents a rising point L of a waveform, the digitizer sections 13-1 to 13-N download a substantially similar waveform data which begins with the trigger point L since the plurality of sampling heads 11-1 to 11-N deliver substantially similar waveform data. Accordingly, an observation, measurement, analysis and the like of the waveform is only allowed after the trigger point of the high rate repeated signals HRS1 to HRSN even with the N channel sampling digitizers shown in FIG. 3.

The sampling digitizer mentioned above is also used in a semiconductor integrated circuit testing equipment (IC tester) which tests a semiconductor integrated circuit (subsequently referred to as IC). Specifically, a sampling digitizer is used in testing whether or not an IC under test can positively respond to a given high rate signal or determining to which high rate signal it can respond by applying a test pattern signal to the IC under test at a high rate, and observing and measuring the waveform of a low rate signal which is converted from a response signal delivered at a high rate from the IC under test.

As is well recognized, an IC having a logic circuit as its main is referred to as a logic IC while an IC having a memory as its main is referred to as a memory IC. An IC having a mixture of a logic section and a memory section in one chip is referred to as a system LSI, a system on chip (SOC) or the like. FIG. 4 shows a schematic arrangement of an IC testing equipment (hereafter referred to as IC tester) which is commonly used in the art. The IC tester shown comprises an IC tester body 100 and a test head 200. In the example shown, the IC tester body 100 comprises a controller 101, a timing generator 102, a pattern generator 103, a waveform formatter 104, a driver 105, a comparator 106, a logic comparator 107, a defect analysis memory 108 and a voltage generator 109.

The test head 200 is constructed separately from the IC tester body 100, and is usually provided with a given number of IC sockets (not shown) which are mounted on the top thereof. The test head 200 internally contains a printed substrate which is referred to as a pin card in the art, and usually a circuit of the IC tester body 100 including the driver 105 and the comparator 106 is mounted on the pin card. The pin card is provided for each I/O pin (input/output terminal) of an IC under test 300. The test head 200 is generally mounted on a test section of an IC conveying and processing unit which is referred to as a handler in the art, and is electrically connected to the IC tester body 100 through signal transmission means such as a cable, an optical fiber or the like.

The IC under test 300 is mounted on the IC socket of the test head 200. A test pattern signal form the IC tester body 100 is applied to the IC under test, which is commonly referred to as DUT, 300 while a response signal from the IC under test 300 is supplied to the IC tester body 100 through the IC socket, thus performing a test and a measurement of the IC under test 300.

The controller 101 comprises a computer system in which a test program prepared by a user or programmer is previously stored, and the entire IC tester is controlled in accordance with the test program. The controller 101 is connected to the timing generator 102, the pattern generator 103, the waveform formatter 104, the logic comparator 107, the defect analysis memory 108 and the voltage generator 109 through a tester bus 111, and the timing generator 102, the pattern generator 103, the waveform formatter 104, the logic comparator 107, the defect analysis memory 108 and the voltage generator 109 operate as terminals to carry out a testing of the IC under test 300 in accordance with control instructions delivered from the controller 101.

A test, for example, a functional test, of the IC under test 300 takes place as follows:

The pattern generator 103 is previously loaded with a pattern generation sequence which is described in the test program which is stored in the controller 101 before starting a test, and in response to a test start instruction from the controller 101, the pattern generator 103 delivers a test pattern data which is to be applied to the IC under test 300 in accordance with the stored pattern generation sequence. ALPG (algorithmic pattern generator) is generally used for the pattern generator 103. ALPG refers to a pattern generator which includes internal registers having arithmetic capabilities to generate a test pattern to be applied to a semiconductor device by arithmetic operations.

Timing data which is delivered every test period and which is described in the test program stored in the controller 101 is previously loaded in the timing generator 102 before starting a test, and the timing generator 102 delivers a clock pulse for each test period in accordance with the stored timing data. Such clock pulse is applied to the waveform formatter 104, the logic comparator 107 and the like.

The waveform formatter 104 defines the timing of a rising edge and a falling edge of a logic waveform on the basis of the test pattern data delivered from the pattern generator 103 and the clock pulse delivered by the timing generator 102 to form a test pattern signal having an actual waveform which varies between an H logic (or logic "1") and an L logic (or logic "0"), which is in turn applied to the IC under test 300 through the driver 105.

The driver 105 controls the amplitude of the test pattern signal delivered from the waveform formatter 104 to a desired value (or to a voltage VIH corresponding to the H logic or logic "1" and a voltage VIL corresponding to the L logic or logic "0") before applying it to the IC socket of the test head 200, thus driving the IC under test 300.

The comparator 106 determines whether or not the logic value of a response signal delivered form the IC under test 300 has a normal logic value, thus, whether a voltage corresponding to the H logic has a value equal to or greater than a given voltage VOH and a voltage corresponding to the L logic has a value equal to or less than a voltage VOL.

When a result of decision is acceptable, an output signal from the comparator 106 representing such result of decision is input to the logic comparator 107 where it is compared against an expected value pattern data which is delivered from the pattern generator 103, thus determining whether or not the IC under test 300 has delivered a normal response signal. A result of comparison by the logic comparator 107 is downloaded into the defect analysis memory 108. In the event a defect has occurred, the test pattern address for which the defect is found, an output logic data on a defective pin or pins on the IC under test 300 and a corresponding expected value pattern data are stored in the defect analysis memory 108, and used in the evaluation of the LSI subsequent to the completion of the test.

The voltage generator 109 generates amplitude voltages VIH and VIL which are to be applied to the driver 105 and compared voltages VOH and VOL which are to be applied to the comparator 106 in accordance with preset values delivered from the controller 101. In this manner, the driver 105 generate drive signals having amplitude values which conform to the specification of the IC under test 300, and the comparator 106 is enabled to determine whether the response signal from the IC under test 300 have logic values for the voltages which conform to the specification of the IC under test 300.

The described sampling digitizer is mounted on the pin card which is contained within the test head 200 in order to observe, measure and/or analyze the waveform of a response signal which is rapidly read out from the IC under test 300, for example. Thus, the test pattern signal is applied at a high rate to the IC under test 300, and the waveform of response signals which are delivered at high rate from respective pins of the IC under test is observed, measured and/or analyzed using the sampling digitizer mentioned above. The observation, the measurement, the analysis and the like of the waveform allows a decision to be rendered whether the IC under test 300 is defective or not. As a result of such test, the operating speed of the IC under test can be classified into categories, for example, and it is also possible to test to which high rate signal the IC under test can positively respond.

As mentioned previously, with a conventional sampling digitizer, the observation, the measurement and/or analysis of the waveform of a high rate repeated signal which is input to a sampling head is possible only after the trigger point. However, it is often desired that a waveform which immediately precedes the trigger point or a waveform across the trigger point be emphatically observed, measured and/or analyzed.

If it is desired to download waveform data which precedes the trigger point into the digitizer section 13 or 13-1 to 13-N in the arrangement of the sampling digitizers shown in FIGS. 1 and 3, it is necessary that the digitizer section 13 or 13-1 to 13-N be operated continuously, and the downloading of waveform data must be interrupted at the trigger point to allow the downloaded data to be read out. Assuming that the waveform data begins to be downloaded immediately after the trigger point, this requires a time interval corresponding to one period (T3) until the next trigger point is reached and the provision of a memory which is capable of storing waveform data for about one period (T3). As a consequence, when it is desired to observe, measure and/or analyze emphatically a waveform region which precedes the trigger point, for example, a waveform region which immediately precedes the trigger point, a time interval corresponding to about one period at most must be provided in order to download the waveform data, and simultaneously there must be provided a memory having a capacity capable of storing the waveform data for about one period. In other words, it has been impossible to download a required waveform region in a reduced length of time.

Alternatively, in order to download a waveform data across the trigger point into the digitizer section 13 or 13-1 to 13-N, it is necessary that the digitizer section 13 or 13-1 to 13-N be operated continuously, and the downloading of the waveform data be interrupted at a point past the trigger point where a given number of samples of waveform data have been acquired. However, it is again necessary to take into consideration that the downloading of waveform data may be started immediately after the trigger point has been passed, and this again requires a time interval corresponding to about one period (T3) until the next trigger point is reached, and the provision of a memory capable of storing the waveform data for at least one period (T3). Thus, the difficulties that a time interval corresponding to one period or greater is necessary and that a memory having a capacity capable of storing the waveform data for at least one period must be provided remain unchanged also when it is desired that a waveform region across the trigger point be emphatically observed, measured and/or analyzed. Again, it has been impossible to download a required waveform region in a reduced length of time.

When a high rate repeated signal HRS is input to the sampling head 11, and when a waveform region which is desired to be observed, measured and/or analyzed or which is desired to be downloaded into the digitizer section 13 represents a rising edge region, it is to be noted that such rising edge region is a very small portion of one period T of the high rate repeated signal HRS, which may be on the order of one-tenth of the period, for example. FIGS. 5A and 5B show the waveform of the high rate repeated signal HRS shown in FIG. 2A and the waveform of the low rate repeated signal LRS1 shown in FIG. 2B to an enlarged scale. If the time interval for the rising edge region LE of the high rate repeated signal HRS having the period T is equal to about one-tenth the period T, it follows that as considered with respect to the low rate repeated signal LRS1 shown in FIG. 5B which is synthesized and reproduced with the equivalent sampling interval Δt (for example, 10 ps), there is a waiting time WT equal to nearly 9/10 the period T3 at most until the beginning (the trigger point Tr) of the rising edge region LE, which is a waveform region to be observed, measured and/or analyzed is reached. It will be noted that this waiting time WT is very long (nearly nine times) in comparison to the time necessary to download the required waveform region LE into the digitizer section 13.

Illustrating this in terms of specific figures, it may be assumed that the rising edge region LE has a time fraction of 1/10, for example, with respect to the period T of the high rate repeated signal HRS, and that $16 \times 10^3$ items of data be downloaded into the digitizer section 13 during the time interval for the rising edge region LE. If a sampling rate of 1 μs is used, a time length of $16 \times 10^3 \times 10^{-6}(\mu s) = 16$ ns is required to download the data in the rising edge region LE. Accordingly, a maximum waiting time WT will be 16 ns×9=144 ns, meaning that a waiting time which is nine times, at maximum, the time interval necessary to download the data for the rising edge region LE is required until the trigger point Tr is reached. Thus, this represents a disadvantage that the efficiency of using the arrangement is greatly degraded.

It is an object of the present invention to provide a sampling digitizer and an associated method which allow a required waveform region to be downloaded in a reduced length of time.

It is another object of the invention to provide a sampling digitizer and an associated method which allow an observation, measurement and/or analysis of a waveform region which precedes a trigger point to be made in a reduced length of time without the need to increase a memory capacity.

It is a further object of the invention to provide a sampling digitizer and an associated method which allow an emphatic observation, measurement and/or analysis of a waveform region across a trigger point to be made in a reduced length of time without the need to increase a memory capacity.

It is an additional object of the invention to provide a sampling digitizer and an associated method for reducing a waiting time until a trigger point is reached and for improving the efficiency of using an arrangement.

It is still another object of the present invention to provide a semiconductor integrated circuit testing equipment which allows a testing time for a semiconductor integrated circuit (IC) to be reduced while enabling a testing with a higher accuracy.

DISCLOSURE OF THE INVENTION

According to a first aspect of the present invention, there is provided a sampling digitizer comprising clock generator means for generating a clock signal, a sampler for sampling an input high rate repeated signal with a clock signal supplied from the clock generator means to convert it into a low rate data signal, a signal waveform observing, measuring or analyzing unit to which the data signal from the sampler is supplied, trigger means to which the data signal from the sampler is supplied for generating a trigger signal when the data signal contains trigger information, delay means for delaying the clock signal supplied from the clock generator means to the sampler, and switching means for switching between the clock signal which is caused to pass through the delay means and the clock signal which is directly supplied from the clock generator means, to be supplied to the sampler. The low rate data signal may comprise a sampled output itself or a digital counterpart of the sampled output. This applies also in the description to follow.

In a preferred embodiment, the switching means carries out a switching between the clock signals in response to the trigger signal from the trigger means. Before the trigger signal is applied, the clock signal which has been caused to pass through the delay means is supplied to the sampler while after the trigger signal from the trigger circuit is applied, the clock signal which is directly delivered from the clock generator means is supplied to the sampler.

The clock signal generated by the clock generator means has a sampling rate corresponding to a period which is defined as a sum of a quotient of the frequency of the high rate repeated signal divided by the frequency of the internal clock signal generated by the clock generator means, multiplied by a time interval corresponding to one period of the high rate repeated signal and an equivalent sampling interval which is equal to the time corresponding to one period of the high rate repeated signal divided by the number of samples per period of the high rate repeated signal.

According to a second aspect of the present invention, there is provided a sampling digitizer having a plurality of channels, each channel including a sampler for sampling an input high rate repeated signal at a given sampling rate to convert it into a low rate data signal and a signal waveform observing, measuring or analyzing unit to which the data signal from the sampler is supplied. In accordance with the present invention, the sampling digitizer further comprises a single clock generator which is common to the plurality of channels for generating a clock signal at a given sampling rate, single trigger means which is common to the plurality of channels to which data signal from the sampler of a specific one of the plurality of channels is supplied as an input signal for generating a trigger signal to be supplied to the signal waveform observing, measuring or analyzing unit of each channel when the data signal contains trigger information, and delay means for causing the clock signal which is supplied from the clock generator means to the sampler of that channel which supplies the data signal to the trigger means to be delayed.

According to a third aspect of the present invention, a sampling digitizer comprises clock generator means for generating a clock signal, a sampler for sampling an input high rate repeated signal with the clock signal supplied from the clock generator means to convert it into a low rate data signal, a signal waveform observing, measuring or analyzing unit to which the data signal from the sampler is supplied, trigger means to which the data signal from the sampler is supplied for generating a trigger signal when the data signal contains trigger information, and means for supplying the trigger signal generated by the trigger means to the clock generator means to increase the frequency of the clock signal which is generated by the clock generator means.

According to a fourth aspect of the present invention, there is provided a semiconductor integrated circuit testing equipment in which a test pattern signal is applied to a semiconductor integrated circuit under test, a response signal which is read out from the semiconductor integrated circuit under test is logically compared, and the semiconductor integrated circuit under test is determined to be acceptable or defective on the basis of a result of the comparison, and comprising a sampling digitizer according to one of the first and the second aspect of the present invention.

In a preferred embodiment, the sampling digitizer is mounted on a pin card which is contained in a test head of the semiconductor integrated circuit testing equipment. Other aspects of the present invention will be described with reference to the embodiments.

BEST MODES OF CARRYING OUT THE INVENTION

First Embodiment

Figure 6:
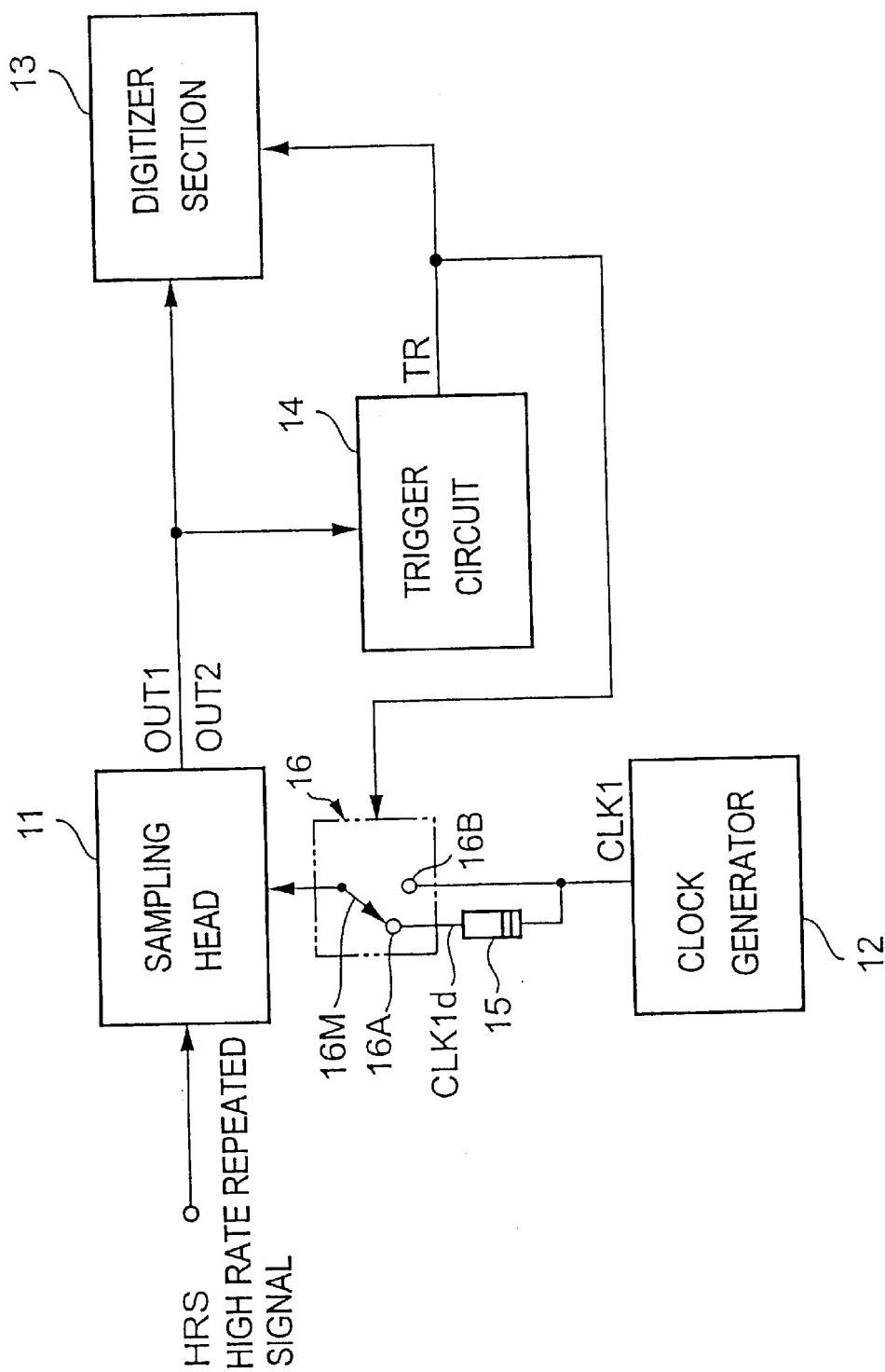
FIG. 6 is a block diagram of a first embodiment of a sampling digitizer according to the present invention.

A first embodiment of the sampling digitizer according to the present invention will be described in detail with reference to FIGS. 6 and 7. In FIG. 6, corresponding parts to those shown in FIG. 1 are designated by like reference numerals as used before, and their description will be omitted unless specifically required.

Figure 1:
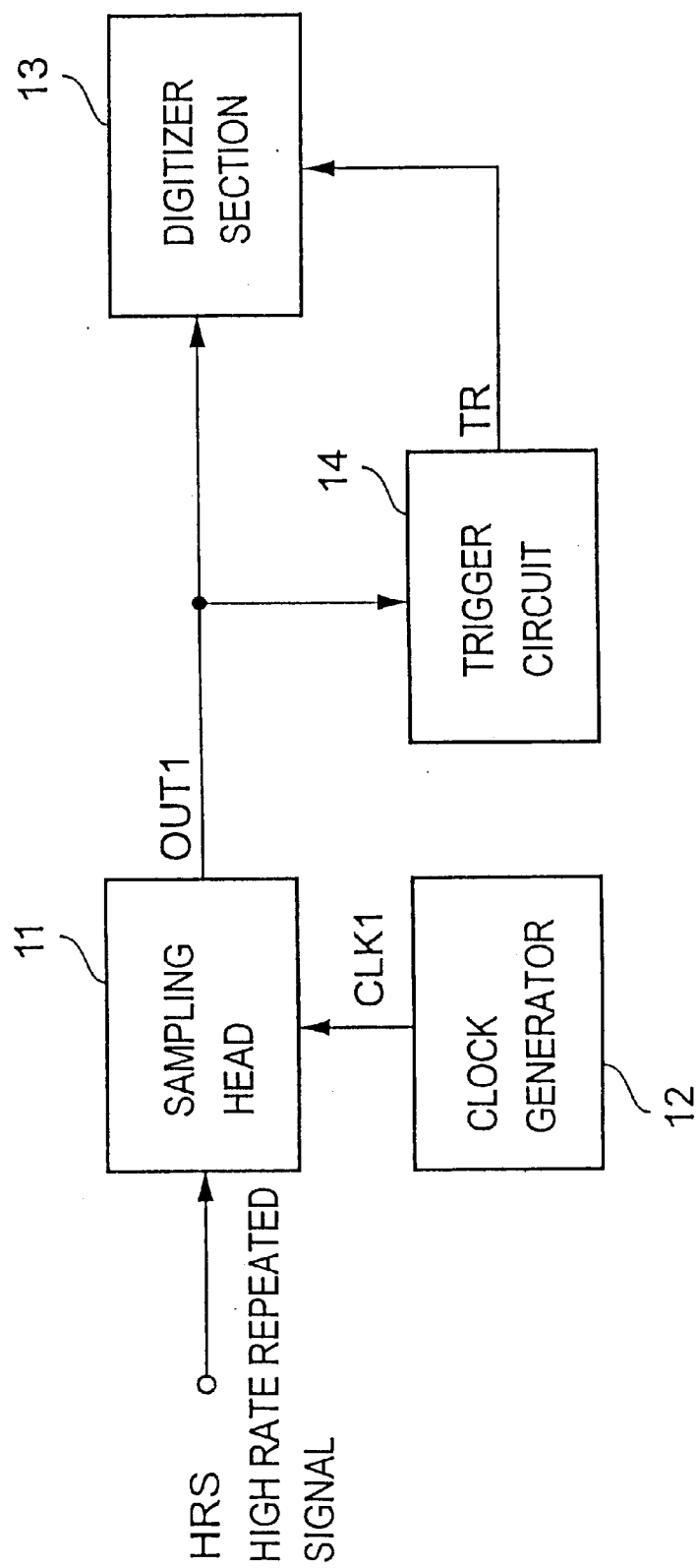
FIG. 1 is a block diagram of an exemplary arrangement of a conventional sampling digitizer.
Figure 2:
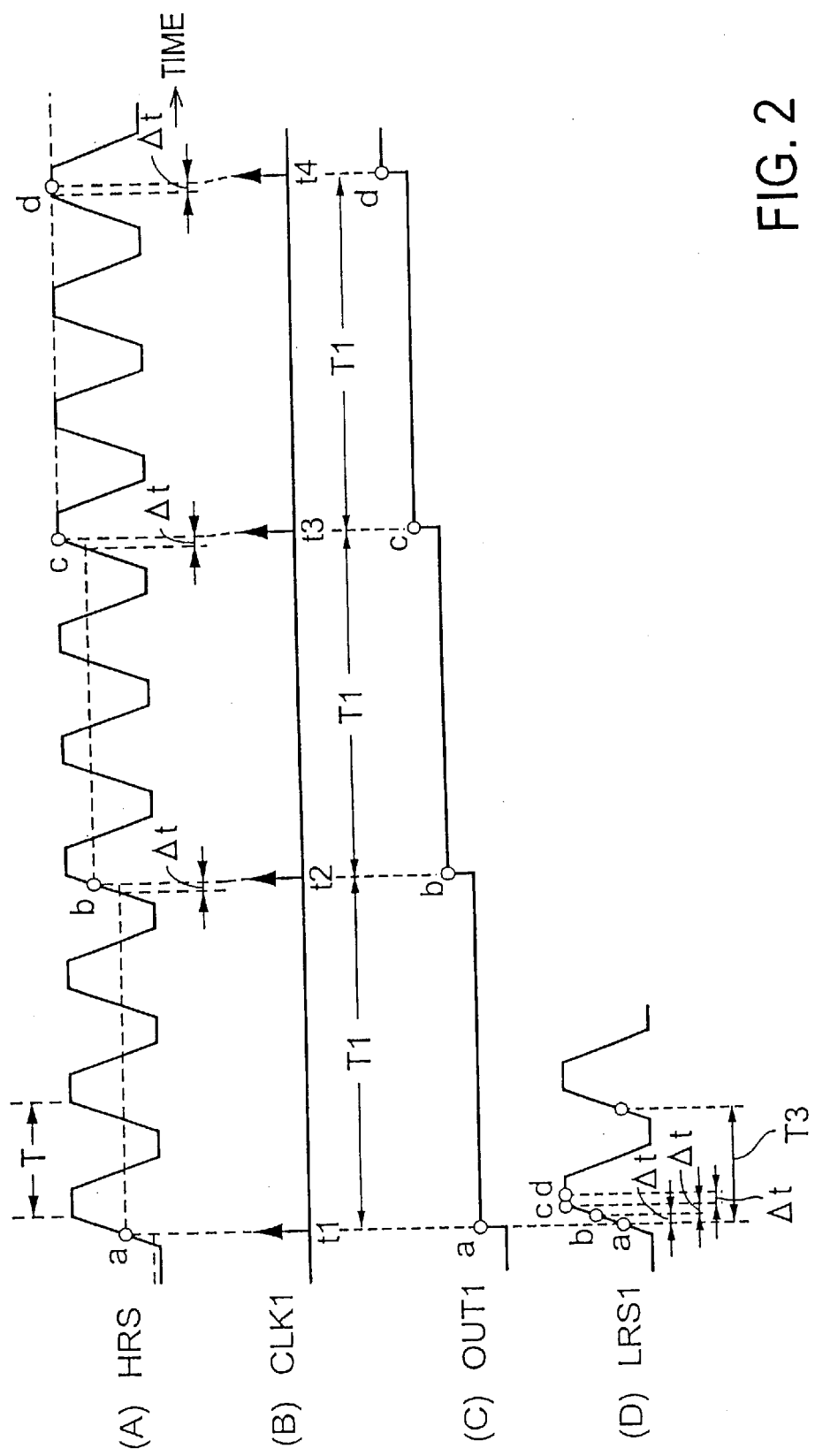
FIG. 2 is a timing diagram illustrating an equivalent sampling technique which is applied to the sampling digitizer shown in FIG. 1.

FIG. 6 is a block diagram of a first embodiment of the sampling digitizer according to the present invention, and comprises a sampling head 11, a clock generator 12, a digitizer section 13 and a trigger circuit 14, in the similar manner as a conventional sampling digitizer shown in FIG. 1. In the sampling digitizer thus constructed, a high rate repeated signal (waveform) HRS which is input to the sampling head 11 is converted by the described equivalent sampling technique into a low rate repeated signal (waveform), which is then observed, measured and/or analyzed to enable an observation, measurement, analysis and the like of the waveform of the high rate repeated signal HRS which is input to the sampling head 11, in the similar manner as described above with reference to FIGS. 1 and 2, and therefore will not be described again.

In this embodiment, a delay element 15 which delays a clock signal CLK1 by a given time interval is connected in parallel with a clock signal transmission path from the clock generator 12 to the sampling head 11, thus providing a pair of clock signal paths, one passing through the delay element 15 and another not passing through the delay element 15. In addition, there is provided a switching circuit 16 which switches between the pair of clock signal transmission paths to connect only one of these clock signal transmission paths to the sampling head 11. The switching circuit 16 includes a switching element which is operated in response to a trigger signal TR from the trigger circuit 14, thus switching the clock signal transmission path.

Specifically, up to a point in time (trigger point) when the trigger signal TR is generated by the trigger circuit 14 at a given timing, the switching circuit 16 connects the clock signal transmission path which passes through the delay element 15 to the sampling head 11. Thus, in this embodiment, a moveable contact 16M of the switching element in the switching circuit 16 is connected to a first fixed contact 16A which is connected to the output end of the delay element 15 until the trigger point. Accordingly, the clock signal CLK1 from the clock generator 12 is supplied as a clock signal CLK1d, which is delayed by a given time interval by the delay element 15, to the sampling head 11.

When the trigger circuit 14 generates the trigger signal TR, which is applied to the switching circuit 16, the switching circuit 16 connects the clock signal transmission path which does not pass through the delay element 15 to the sampling head 11. Specifically, the moveable contact 16M of the switching element in the switching circuit 16 is thrown to a second fixed contact 16B which is connected to the clock signal transmission path not passing through the delay element 15. Accordingly, the clock signal CLK1 from the clock generator 12 is directly supplied to the sampling head 11 without being delayed.

The operation of the sampling digitizer described above will now be described with reference to a series of timing diagrams shown in FIG. 7.

By way of example, when a high rate repeated signal HRS1 of a period T is input to the sampling head 11, as indicated in FIG. 7A, the clock generator 12 is caused to generate the clock signal CLK1 at a given sampling rate T1=(nT+Δt) and to supply it to the sampling head 11 directly through the clock signal transmission path which does not pass through the delay element 15 so that the sampling timings t1, t2, t3, . . . with respect to the high rate repeated signal HRS1 have phases which are sequentially offset by a given minimal interval or the equivalent sampling interval Δt (in the example shown, the phase of the sampling timing is sequentially delayed by the equivalent sampling interval Δt), as shown in FIG. 7B. The sampling head 11 then delivers a low rate data signal OUT1 at the sampling rate T1, the low rate data signal OUT1 being a result of conversion into a waveform data train a1, b1, c1, . . . in which the amplitude level changes stepwise at the sampling timings t1, t2, t3, . . . The waveform data time a1, b1, c1, . . . is downloaded into the digitizer section 13 where it is synthesized with a time interval corresponding to the equivalent sampling interval Δt to reproduce a low rate repeated signal LRS1 having a period T3 which is a result of multiplication between the sampling rate T1 and the number of samples per period T of the high rate signal HRS1, as shown in FIG. 7E.

By contrast, when the clock signal CLK1 which is generated by the clock generator 12 at the given sampling rate T1 is supplied through the clock signal transmission path which passes through the delay element 15 to be supplied as a clock signal CLK1d to the sampling head 11, the sampling timings indicated by the clock signal CLK1d are all delayed by a given delay time Dt which is caused by the delay element 15. In other words, this is equivalent to supplying the clock signal CLK1d to the sampling head 11 at the given sampling rate T1 starting at a point in time which is delayed by the given delay time Dt. As a consequence, the sampling head 11 delivers a low rate data signal OUT2 which is a result of conversion into a waveform data time a2, b2, c2, . . . which the amplitude level changes stepwise at delayed sampling timings t1+Dt, t2+Dt, t3+Dt, . . . , as shown in FIG. 7F. The waveform data train a2, b2, c2, . . . is downloaded into the digitizer section 13, and is synthesized with a time interval corresponding to the equivalent sampling interval Δt to reproduce a low rate repeated signal LRS2 having a period T3 which is a result of multiplication of the sampling rate T1 and the number of data samples per period T of the high rate signal HRS1, as shown in FIG. 7G.

Figure 7:
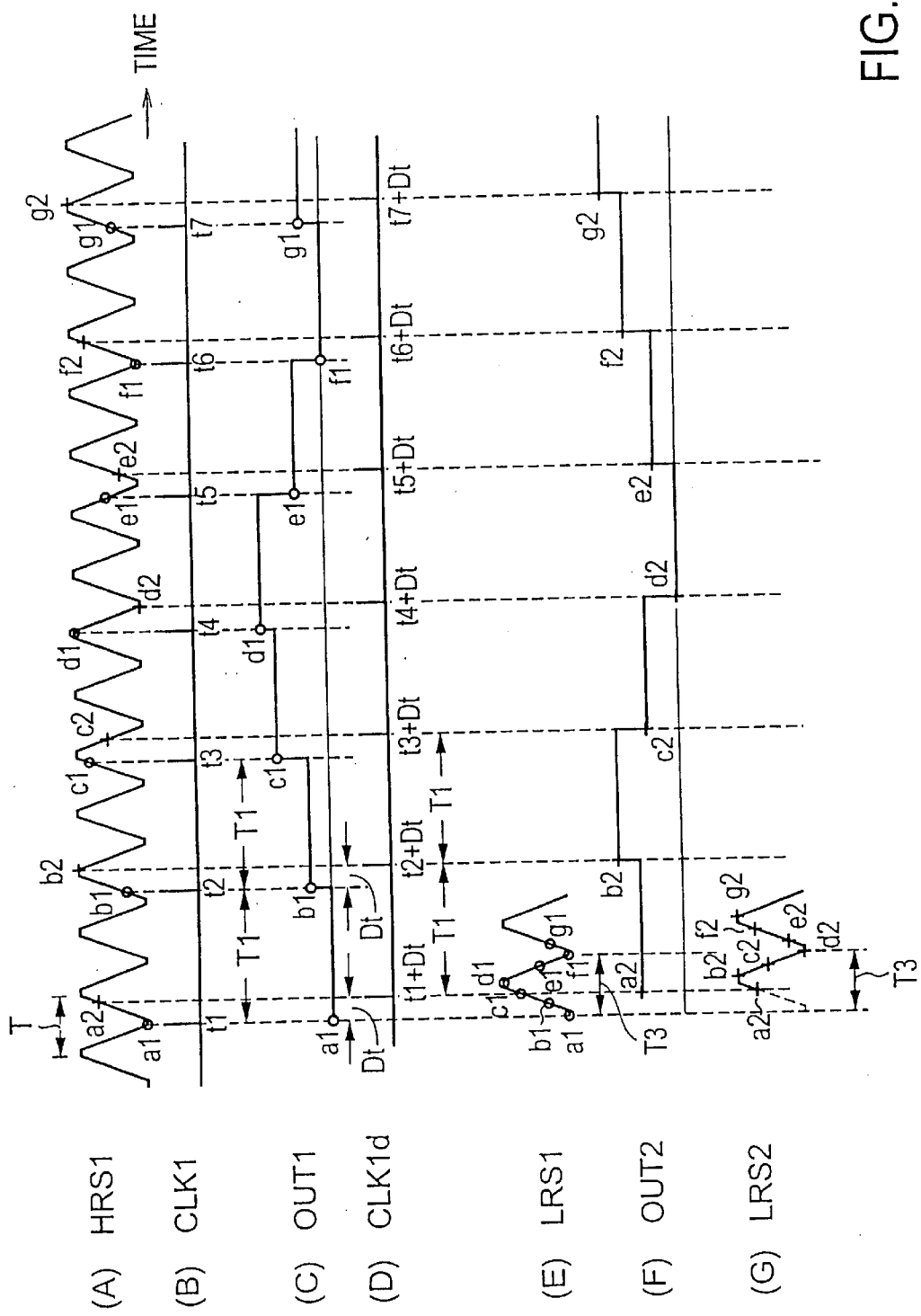
FIG. 7 is a series of timing diagrams illustrating the operation of the sampling digitizer shown in FIG. 6.

It will be easily seen from FIG. 7 that the low rate repeated signal LRS2 represents a waveform which is synthesized from data sampled from the high rate repeated signal HRS1 at waveform points which are advanced in time by Dt because the sampling timing is delayed by the delay time Dt of the delay element 15. As a consequence, when compared against the waveform of the low rate repeated signal LRS1 shown in FIG. 7E which is obtained when the clock signal CLK1 is not delayed, this waveform is advanced in time by Dt. Stated differently, this is equivalent to downloading the waveform into the digitizer section 13 at an earlier point than when the clock signal CLK1 is not delayed. Accordingly, when the waveform data is downloaded into the digitizer section 13 with a delayed sampling timing, an observation, a measurement and/or an analysis of a waveform region which is advanced in time than when the sampling timing is not delayed can be made.

Thus, according to the first embodiment, up to the trigger point, the clock signal CLK1 which is generated by the clock generator 12 at the given sampling rate T1 is supplied, as the delayed clock signal CLK1d on the clock signal transmission path passing through the delay element 15, to the sampling head 11. The consequence of this is downloading data which is obtained by sampling waveform points a2, b2, c2, . . . in the high rate repeated signal HRS1 into the digitizer section 13, and accordingly, the waveform which is subject to the observation, measurement and/or analysis is the waveform shown in FIG. 7G which begins with the waveform point a2 in the low rate repeated signal LRS2.

Subsequently, when the trigger circuit 14 generates the trigger signal TR, the latter is supplied to the digitizer section 13 and the switching circuit 16, thus throwing the moveable contact 16M of the switching element in the switching circuit 16 to the second fixed contact 16B. Consequently, the clock signal CLK1 is directly supplied to the sampling head 11 on the clock signal transmission path which does not pass through the delay element 15, thus downloading data which is obtained by sampling waveform points a1, b1, c1, . . . in the high rate repeated signal HRS1 into the digitizer section 13. Accordingly, the waveform which is subject to the observation, measurement and/or analysis is the waveform shown in FIG. 7E which begins with the waveform point a1 in the low rate repeated signal LRS1.

Thus, when the trigger signal TR is generated, waveform data from the waveform point a1 which precedes the trigger point a2 in time is downloaded into the digitizer section 13, allowing a waveform region which precedes in time a different waveform region that has been already subject to the observation, measurement or analysis to be again subject to the observation, measurement or analysis. In this manner, it becomes possible to download a waveform region which is located across the trigger point emphatically and efficiently for purpose of observation, measurement or analysis.

It will be understood from the foregoing description that the amount of delay Dt which is caused by the delay element 15 must be equal to at least the equivalent sampling interval Δt or greater because of the need for the data which is sampled before the trigger point to be downloaded. A maximum value of the amount of delay Dt depends on the location of a waveform region which precedes the trigger point and which is required for the observation, measurement and/or analysis of the waveform. The required waveform region varies depending on the high rate repeated signal HRS which is to be subject to such observation, measurement and/or analysis, and therefore, a maximum value of the amount of delay Dt is chosen so that it contains the required waveform region which precedes the trigger point.

Figure 8:
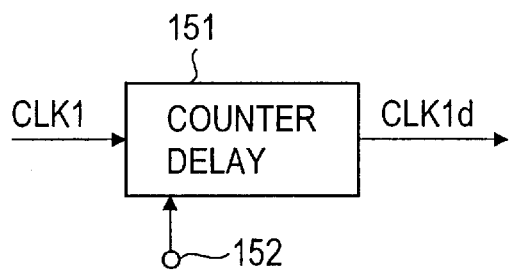
FIGS. 8A and 8B show specific examples of a delay element 15 shown in FIG. 6.
Figure 8:
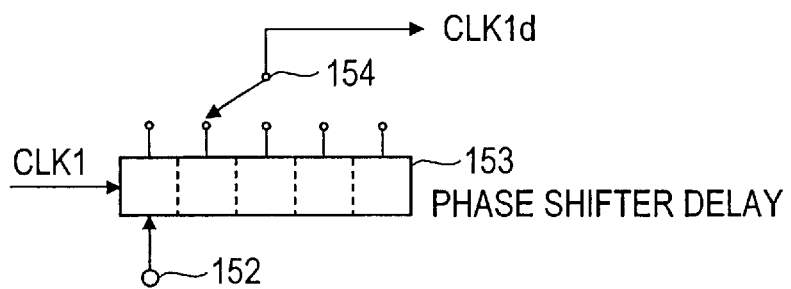

The delay element 15 may comprise a delay line such as a cable, a counter delay 151 as shown in FIG. 8A or a phase shifter delay 153 as shown in FIG. 8B. The counter delay 151 includes a counter, to which an operating clock having a frequency equal to or greater than 1/Δt, for example, is supplied from a terminal 152, and when a preset number of operating clocks are counted, the clock signal CLK1 which is input is delivered as the delayed clock signal CLK1d. The phase shifter delay 153 may comprise a shift register, for example, in which each time a shift clock is applied to a terminal 152, the input clock signal CLK1 shifts by one stage and a delayed clock signal CLK1d is delivered from a shift stage which is chosen by a switch 154. The counter delay 151 or the phase shifter delay 153 provides a variable amount of delay, allowing the amount of delay to be easily set up in accordance with the time interval by which the required waveform region should precede the trigger point.

It will be apparent from the foregoing description that in the first embodiment, a waveform region located across the trigger point can be emphatically and efficiently downloaded into the digitizer section 13 by merely changing the sampling timing determined by the clock signal as before and after the trigger point, and accordingly, only a required waveform region across the trigger point can be downloaded in a reduced length of time. This also eliminates the need for the provision of a high capacity memory which is capable of storing waveform data for about one period (T3).

Second Embodiment

A second embodiment of the sampling digitizer according to the present invention will now be described with reference to FIGS. 9 and 10. Parts corresponding to those shown in FIG. 3 are designated by like reference numerals as used before in FIG. 9, and their description will be omitted unless specifically required.

Figure 9:
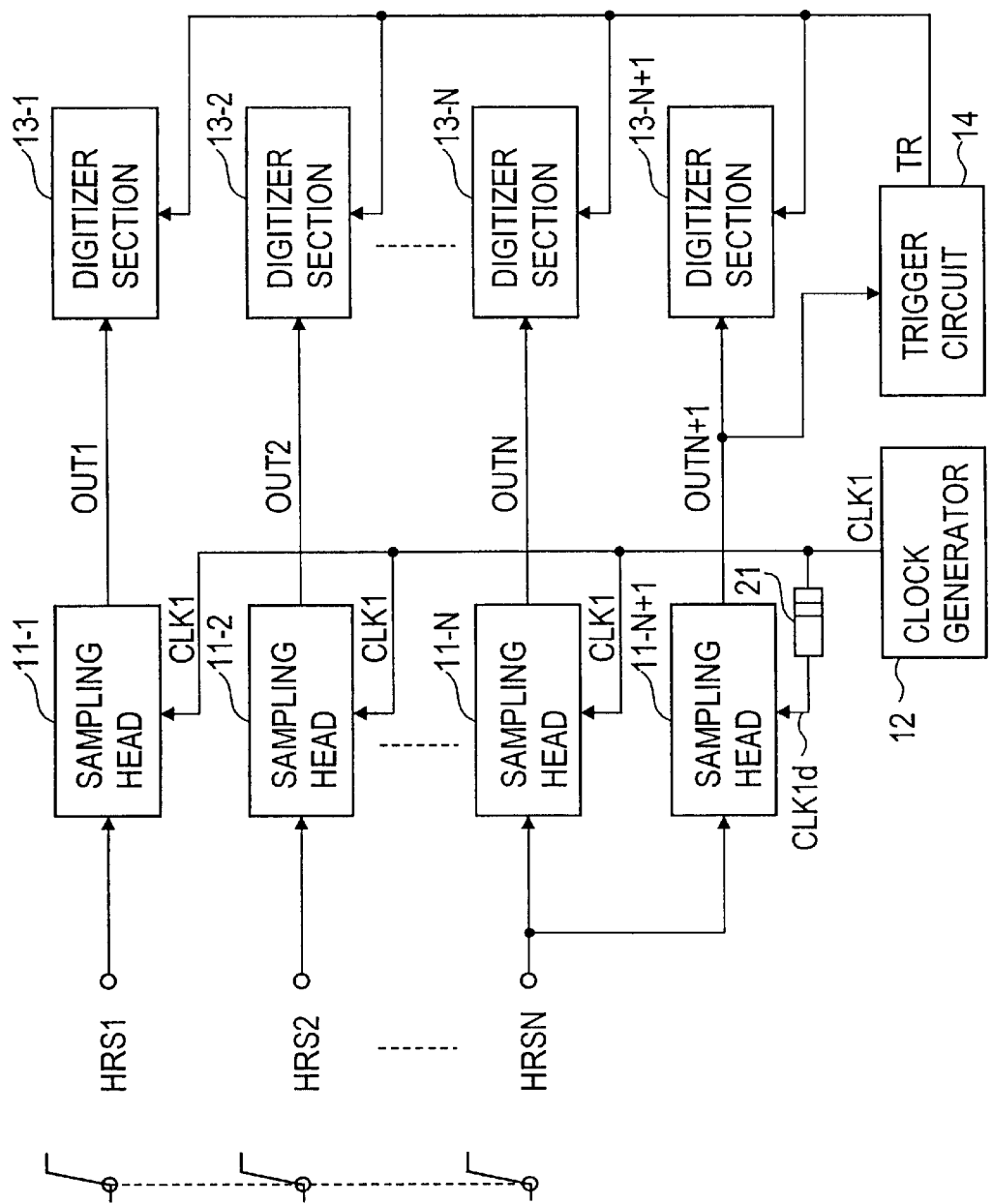
FIG. 9 is a block diagram of a second embodiment of the sampling digitizer according to the present invention.

FIG. 9 is a block diagram of the second embodiment of the sampling digitizer according to the present invention, illustrating an N channel sampling digitizer (where N is an integer equal to or greater than 2) including a plurality of sampling heads 11 and digitizer sections 13 in which the equivalent sampling technique mentioned above is used to convert a high rate repeated signal into a low rate repeated signal, the waveform of which is subject to an observation, a measurement, an analysis or the like by the plurality of digitizer sections simultaneously.

Figure 3:
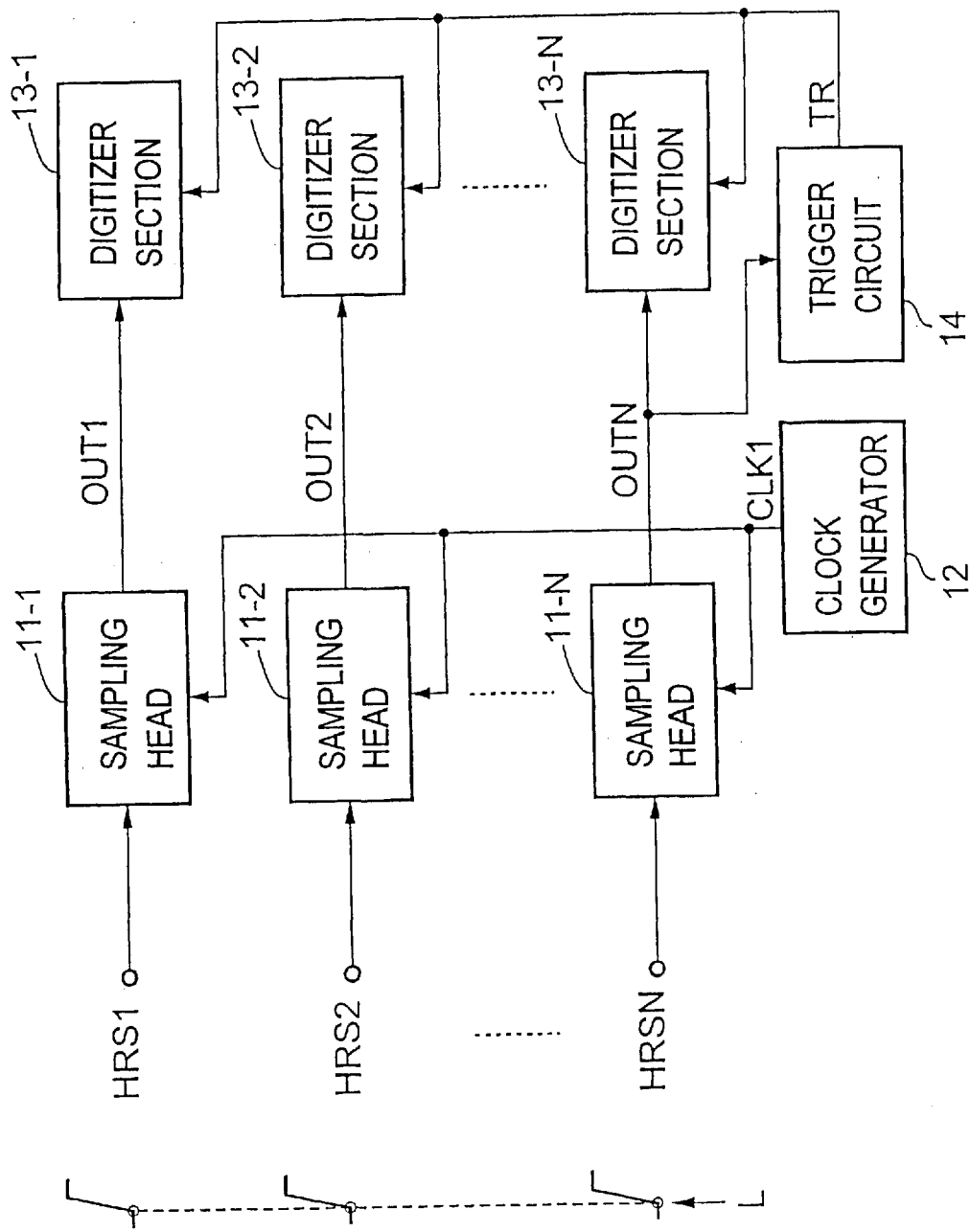
FIG. 3 is a block diagram of another exemplary arrangement of a conventional sampling digitizer.
Figure 4:
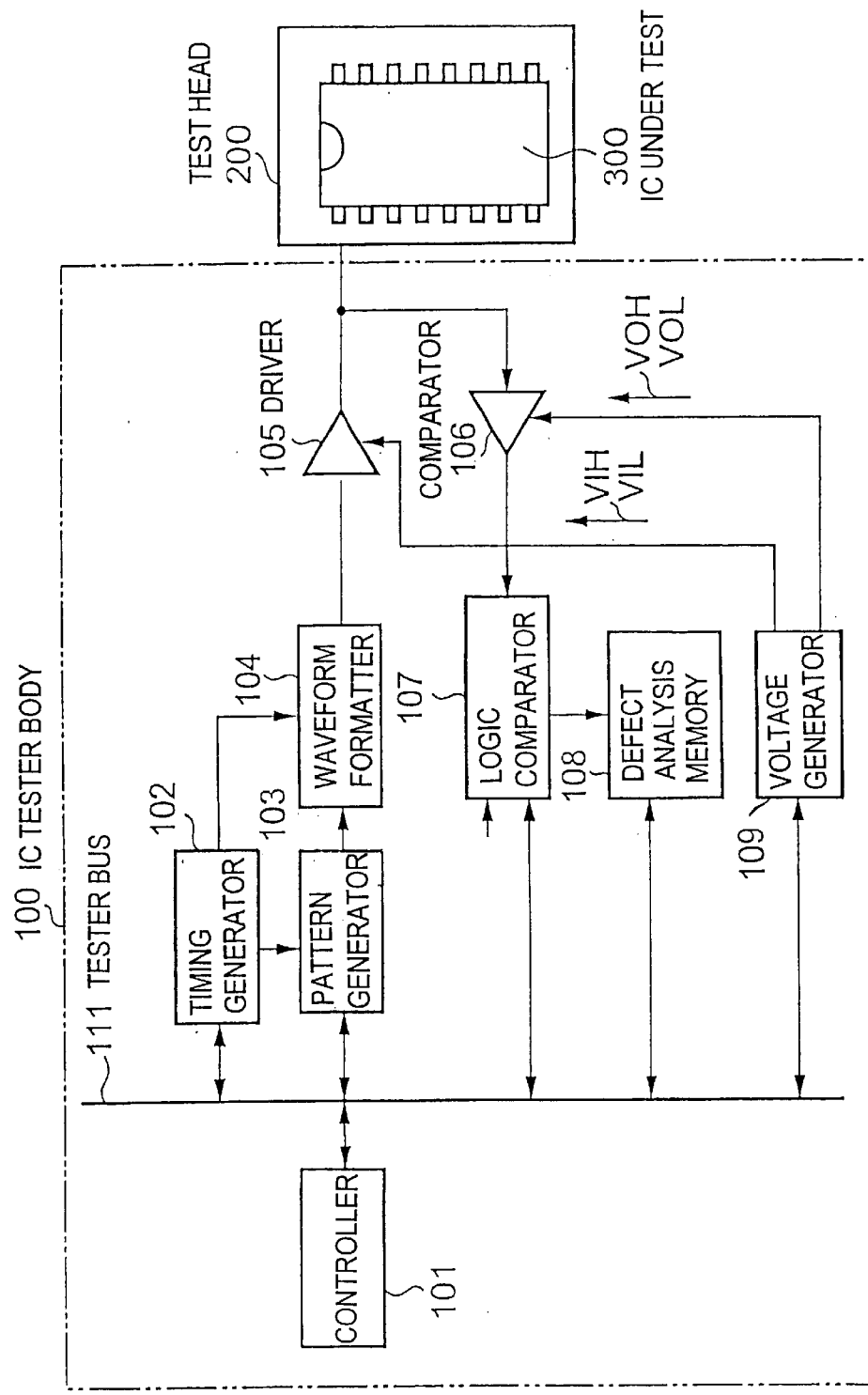
FIG. 4 is a block diagram of an example of a conventional IC testing equipment.

In the second embodiment, a single clock generator 12 is provided for a plurality of sampling heads 11-1, 11-2, . . . , 11-N in common, in the similar manner as in the conventional arrangement shown in FIG. 3, and a further sampling head 11-N+1 is provided for purpose of detecting a trigger, and a high rate repeated signal from one of other sampling heads, which is signal HRSN from the sampling head 11-N in the example shown, is input thereto. A single trigger circuit 14 is provided for the plurality of digitizer sections 13-1, 13-2, . . . , 13-N in common. The clock generator 12 directly delivers a clock signal to the plurality of sampling heads 11-1 to 11-N, but a delay element 21 is inserted in a clock signal transmission path to the trigger detecting sampling head 11-N+1 for delaying the clock signal by a given time interval Dt. An output from only the trigger detecting sampling head 11-N+1 is supplied to the trigger circuit 14.

In the above arrangement, a plurality of high rate repeated signals HRS1, HRS2, . . . , HRSN of substantially equal phase, which may be simultaneously rising signals, for example, are input to associated sampling heads 11-1, 11-2, . . . 11-N, respectively, and the common clock generator 12 generates a clock signal CLK1 at a given sampling rate T1=(nT+Δt) to deliver it to the sampling heads 11-1 to 11-N so that phases of the sampling timings t1, t2, t3, . . . for the repeated signals HRS1 to HRSN are sequentially offset by the equivalent sampling interval Δt (the phase of the sampling timing may be sequentially delayed by Δt, for example). All the sampling heads 11-1 to 11-N in the first to the N-th channel are then simultaneously fed with the clock signal CLK1 at the sampling timings t1, t2, t3, . . . as shown in FIG. 10B while the sampling head 11-N+1 of the (N+1)-th channel (trigger channel) is fed with a clock signal CLK1d at the sampling timings t1+Dt, t2+Dt, t3+Dt, . . . which are delayed by the interval Dt by the delay element 21, as shown in FIG. 10D. Since the plurality of high rate repeated signal HRS1 to HRSN are all identical in waveform, a high rate repeated signal HRS1 fed to the first channel sampling head 11-1 is shown in FIG. 10A as a typical one.

As a consequence, the first to the N-th channel sampling head 11-1 to 11-N deliver low rate data signals OUT1, OUT2, . . . OUTN at substantially the same phase, these low rate data signals being generated as converted into waveform data trains a1, b1, c1, . . . which the amplitude level changes stepwise at the sampling timings t1, t2, t3, . . . , as shown in FIG. 10C. Accordingly, the waveform data train a1, b1, c1, . . . shown in FIG. 10C is downloaded into each of the first to the N-th channel digitizer section 13-1 to 13-N where these data trains are synthesized with a time interval corresponding to the equivalent sampling interval Δt to reproduce low rate repeated signals LRS1 to LRSN shown in FIG. 10E.

By contrast, the (N+1)-th channel sampling head 11-N+1 delivers a low rate data signal OUTN+1, which is obtained as converted into a waveform data train a2, b2, c2, . . . in which the amplitude level changes stepwise at the delayed sampling timings t1+Dt, t2+Dt, t3+Dt, . . . as shown in FIG. 10F. The waveform data train a2, b2, c2, . . . shown in FIG. 10F is downloaded into the (N+1)-th channel digitizer section 13-N+1 to be synthesized with a time interval corresponding to the equivalent sampling interval Δt to reproduce a low rate repeated signal LRSN+1 which is advanced in time by Dt as compared with the low rate repeated signals LRS1 to LRSN shown in FIG. 10E.

Data signal OUTN+1 is supplied from the (N+1)-th channel sampling head 11-N+1 to the trigger circuit 14, and assuming that a trigger point where the trigger circuit 14 generates a trigger signal TR is represented by a waveform point a2 in the high rate repeated signal HRS1 shown in FIG. 10A, for example, the trigger circuit 14 generates the trigger signal TR when the waveform data a2 is supplied from the (N+1) channel sampling head 11-N+1. When the trigger signal TR is generated, the digitizer sections 13-1 to 13-N of respective channels simultaneously begin to download the waveform data, and accordingly, the waveform data trains as represented by the waveform data train a1, b1, c1, . . . shown in FIG. 10C are downloaded into the digitizer sections 13-1 to 13-N of the first to the N-th channel, and the waveform data train a2, b2, c2, . . . shown in FIG. 10F is downloaded into the digitizer section 13-N+1 of the (N+1)-th channel.

Figure 10:
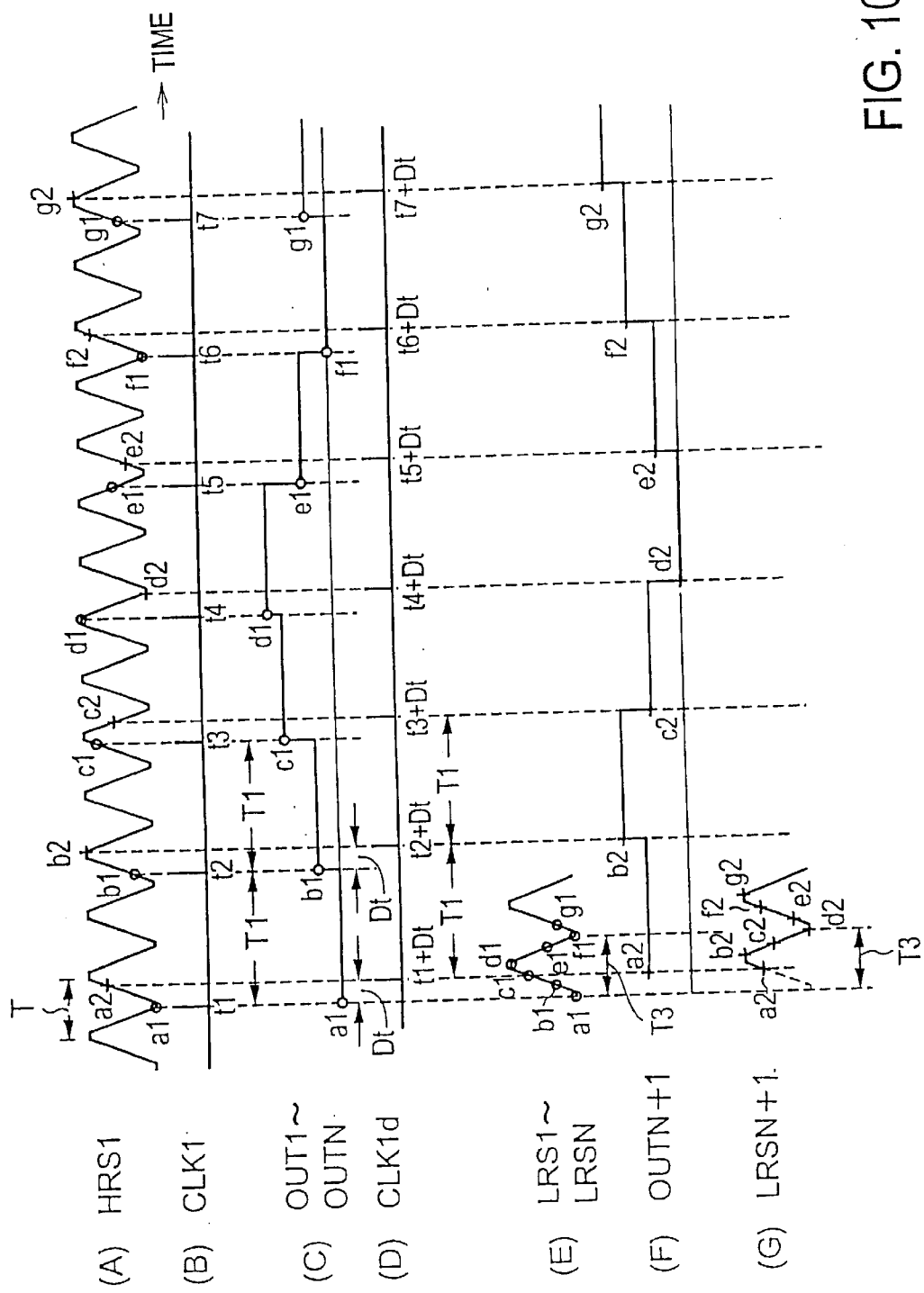
FIG. 10 is a series of timing diagrams illustrating the operation of the sampling digitizer shown in FIG. 9.

Thus the generation of the trigger signal TR by the trigger circuit 14 enables an observation, measurement and/or analysis of the waveforms which occur subsequent to the waveform point al of the low rate repeated signals LRS1 to LRSN shown in FIG. 10E in the digitizer sections 13-1 to 13-N of the first to the N-th channel, and also enables an observation, measurement and/or analysis of the waveform which occurs subsequent to the waveform point a2 of the low rate repeated signal LRSN+1 shown in FIG. 10 in the digitizer section 13-N+1 of the (N+1)-th channel. In other words, an observation, measurement or analysis of a waveform region since a waveform point a1 which precedes the trigger point a2 in time can be made in each of the digitizer sections 13-1 to 13-N of the first to the N-th channel, and an observation, measurement and/or analysis of a waveform since the trigger point a2 can be made in the digitizer section 13-N+1 of the (N+1)-th channel. Thus, in the second embodiment also, a waveform region located across the trigger point can be emphatically and efficiently downloaded into the digitizer sections 13-1 to 13-N for purpose of observation, measurement or analysis. While the (N+1)-th channel is provided in addition to the first to the N-th channel which are provided for the N input high rate repeated signals in this example, if there is a sufficient number of channels for high rate repeated signals, one of them may be utilized as a trigger channel. The digitizer section 13-N+1 for the trigger channel may be omitted.

It will be evident from the foregoing description that in the second embodiment, the delay element 21 which delays the clock signal by the given time interval Dt is inserted in only one of the clock signal transmission paths from the clock generator 12 to the plurality of sampling heads 11-1 to 11-N+1, namely, the clock signal transmission path to the sampling head of the channel which feeds the converted low rate data signal to the common trigger circuit 14, and accordingly, a waveform region across the trigger point can be emphatically and efficiently downloaded into the digitizer in a reduced length of time. Also, the need to provide a high capacity memory capable of storing waveform data for at least one period (T3) is eliminated. The delay element 21 may be similar to the delay element 15. The amount of delay required for the delay element 21 is also similar to the amount of delay required for the delay element 15.

Third Embodiment

Figure 12:
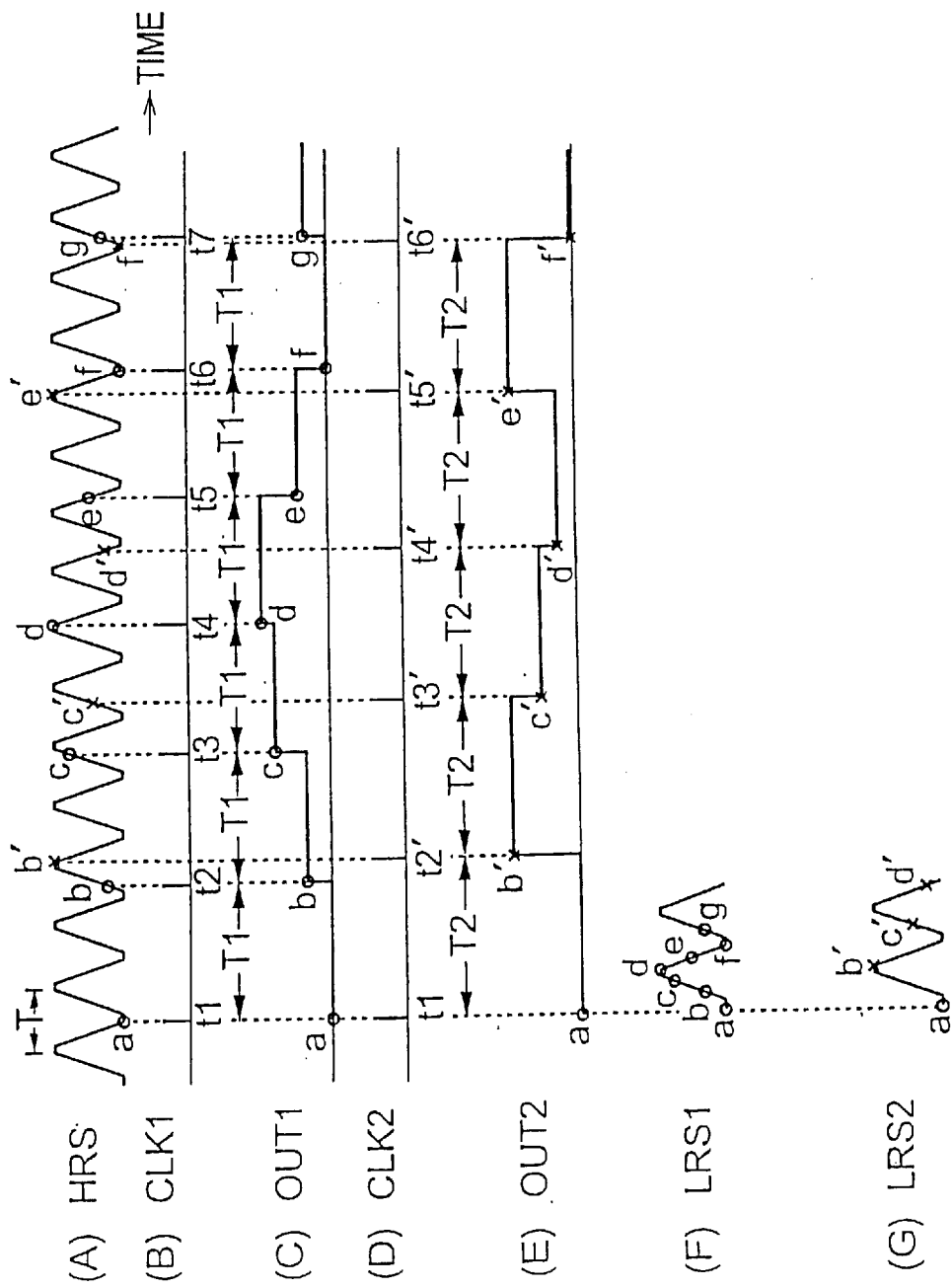
FIG. 12 is a series of timing diagrams illustrating the operation of the sampling digitizer shown in FIG. 11.
Figure 13:
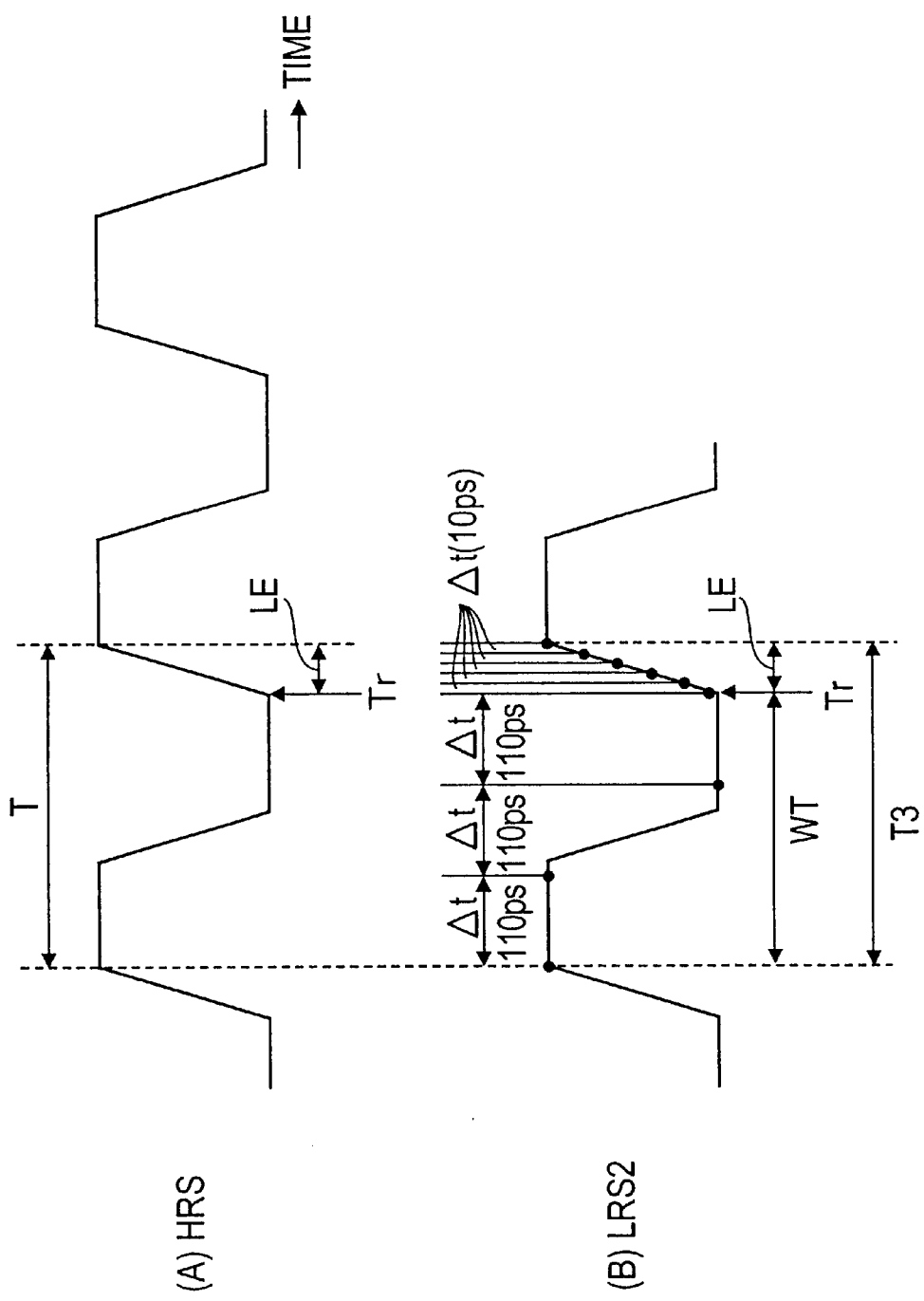
FIG. 13 shows waveform diagrams illustrating the operation of the sampling digitizer shown in FIG. 11.

A third embodiment of the sampling digitizer according to the present invention will be described in detail with reference to FIGS. 11 to 13. It is to be understood that in FIG. 11, parts corresponding to those shown in FIG. 1 are designated by like reference numerals and characters as used before, and will not be described unless specifically required.

In the third embodiment, a trigger signal TR generated by a trigger circuit 14 is supplied not only to a digitizer section 13, but also to a clock generator 12 in order to change the frequency of a clock signal generated by the clock generator 12. The clock generator 12 supplies the clock signal having a changed frequency to a sampling head 11, thus executing the equivalent sampling technique. Specifically, in the third embodiment, the clock generator 12 generates and supplies to the sampling head 11 a clock signal CLK2 shown in FIG. 12D which has a frequency slightly less than the frequency $(1/(nT+\Delta t))$ of a given clock signal CLK1 shown in FIG. 12B until the trigger signal TR from the trigger circuit 14 is received, but upon receiving the trigger signal TR, it generates and supplies to the sampling head 11 the given clock signal CLK1 shown in FIG. 12B.

When the clock generator 12 generates the clock signal CLK2 shown in FIG. 12D which has a frequency slightly less than the frequency of the given clock signal CLK1 and supplies it to the sampling head 11, the latter delivers a low rate data signal OUT2 at a sampling rate T2, the signal OUT2 being converted into the form of a waveform data train a, b', c' . . . in which the amplitude level changes stepwise at sampling timings t1, t2', t3' . . . , as shown in FIG. 12E. The waveform data train a, b', c' . . . is downloaded into the digitizer section 13 where it is synthesized with a time interval of the equivalent sampling interval $\Delta t$ to reproduce a low rate repeated signal LRS2 shown in FIG. 12G and having a period represented by the multiplication of the sampling rate T2 and the number of samples per period T of the high rate repeated signal HRS1.

Upon receiving the trigger signal TR, the clock generator 12 switches from the clock signal CLK2 to the given clock signal CLK1 shown in FIG. 12B to feed the sampling head 11 while maintaining the continuity of the phase, and accordingly, the sampling head 11 delivers a low rate data signal OUT1 at the sampling rate T1, which low rate data signal is converted into a waveform data train a, b, c, . . . in which the amplitude level changes stepwise at the sampling timings t1, t2, t3, . . . as shown in FIG. 12C. The waveform data train a, b, c, . . . is downloaded into the digitizer section 13 where it is synthesized with a time interval corresponding to the equivalent sampling interval $\Delta t$ to reproduce a low rate repeated signal LRS1 shown in FIG. 12F and having a period which is represented by a multiplication of the sampling rate T1 and the number of samples per period T of the high rate repeated signal HRS.

Figure 11:
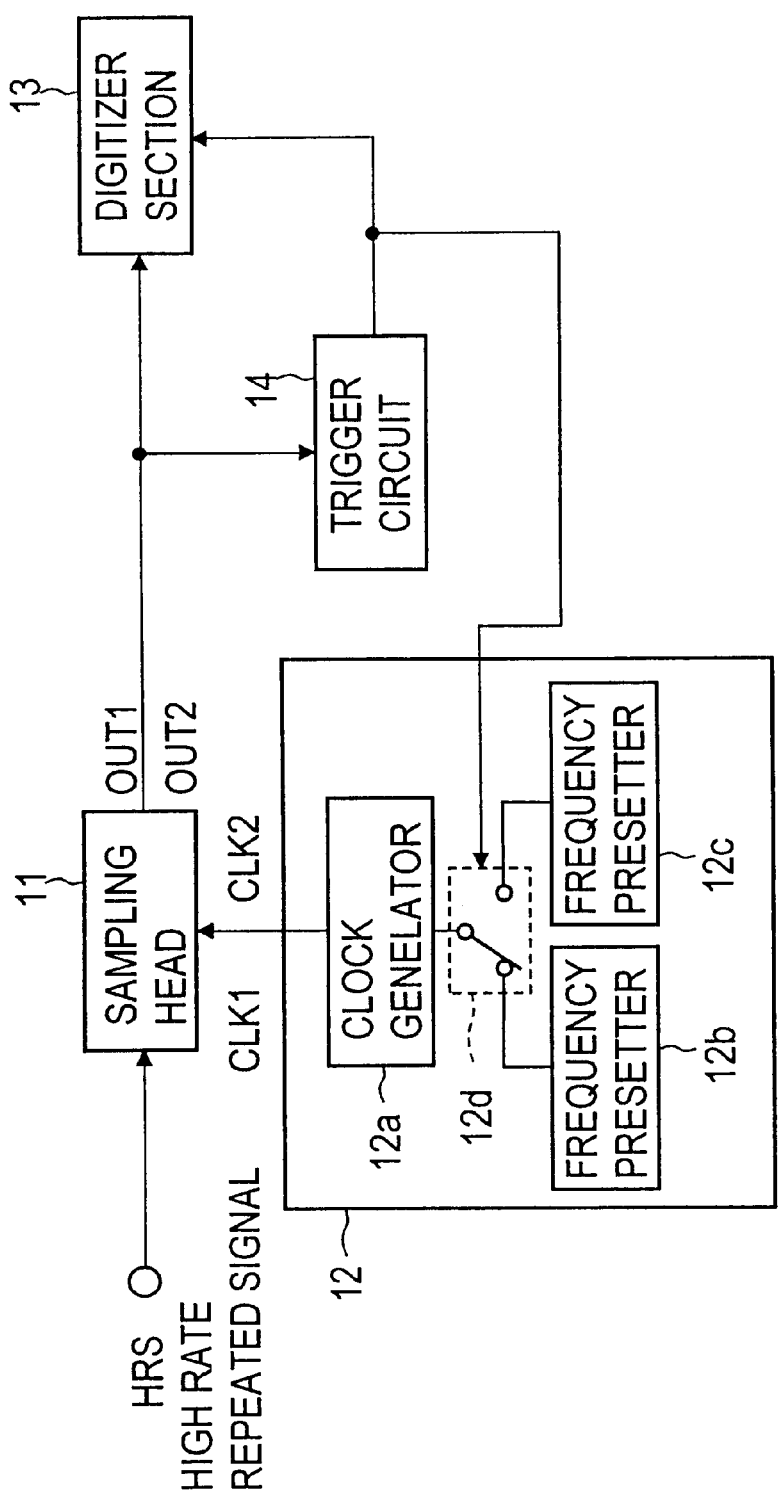
FIG. 11 is a block diagram of a third embodiment of the sampling digitizer according to the present invention.

A switching between the clock signals CLK1 and CLK2 takes place in a manner shown in FIG. 11, for example. A clock generator 12a is associated with a pair of frequency presetters (for example, registers) 12b and 12c, which are switchably connected to the clock generator 12a through a change-over switch 12d. Before the trigger signal TR is generated by the trigger circuit 14, the change-over switch 12d connects the frequency presetter 12b to the clock generator 12a, which therefore generates the clock signal CLK2. When the trigger signal TR is generated, the change-over switch 12d is controlled in accordance therewith to connect the frequency presetter 12c to the clock generator 12a, which switches to generating the clock signal CLK1 while maintaining the continuity of the phase. Thus an interval between the sampled waveform data which occurs when the trigger signal TR is generated and its preceding sampled waveform data is equal to T2, and an interval between the sampled waveform data when the trigger signal TR is generated and its immediately following sampled waveform data is equal to T1.

Figure 5:
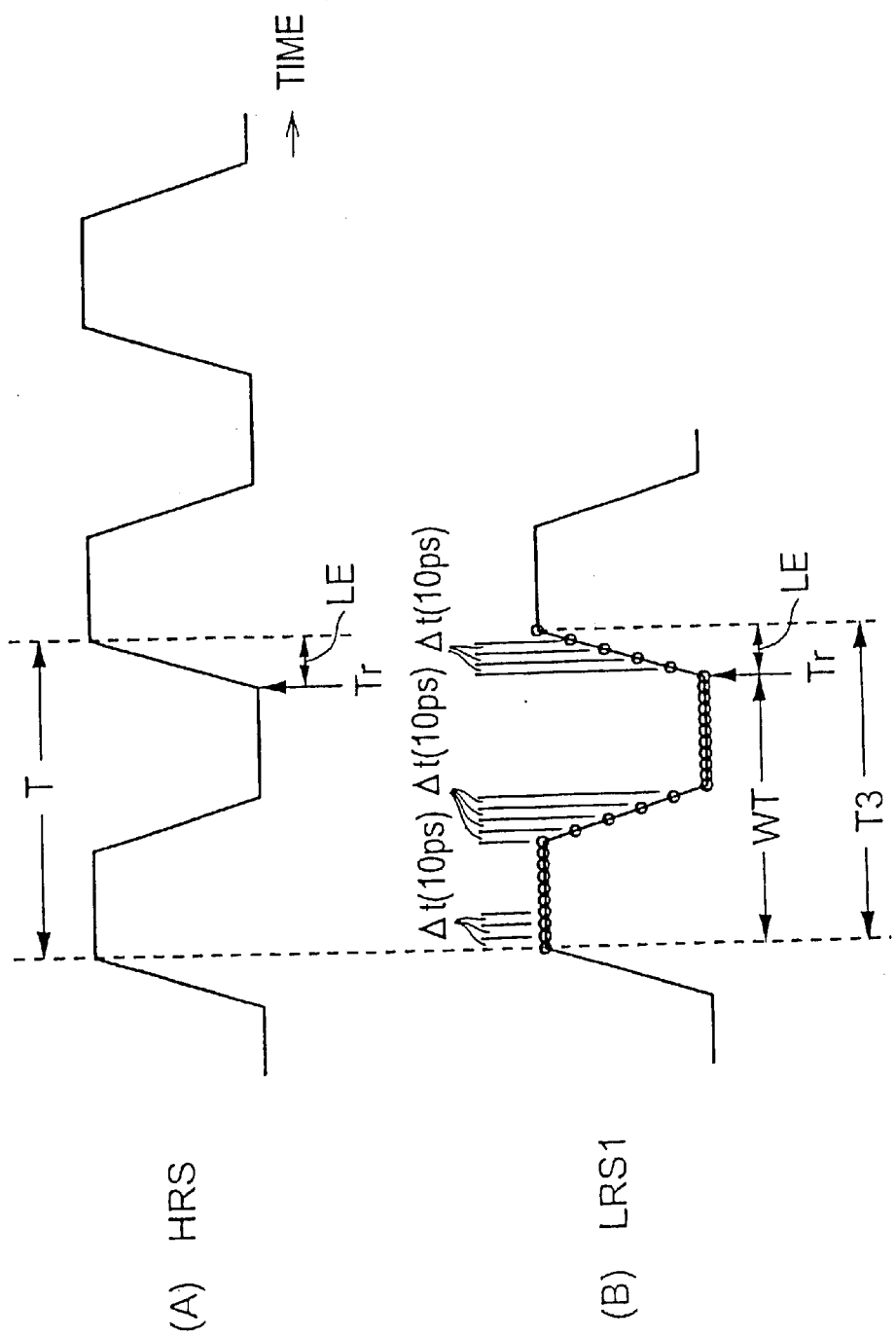
FIG. 5 is a waveform diagram illustrating the operation of the sampling digitizer shown in FIG. 1.

Describing this in terms of specific figures, it may be assumed that the frequency of the high rate repeated signal HRS shown in FIG. 12A is equal to 1 GHz (accordingly, its period T is equal to 1 ns) and the frequency F of the clock signal CLK of the period nT which is not added with the equivalent sampling interval $\Delta t$ is equal to 1 MHz and that the number of samples per period (1 ns) of the high rate repeated signal HRS when the given clock signal CLK1 shown in FIG. 12B is generated is equal to 100 (meaning that 100 data items are acquired per period T). In this instance, a time interval between two adjacent sampled points in the sampled waveform when the given clock signal CLK1 shown in FIG. 12B is generated or the equivalent sampling interval $\Delta t$ is equal to 10 ps, as mentioned previously in connection with FIGS. 2 and 5. In this instance, n=1 GHz/1 MHz=1000, and it follows that the frequency (1/T1) of the given clock signal CLK1 generated by the clock generator 12 is given as $\frac{1}{1.0000}$ $\mu$s 0.999990 MHz since the sampling rate T1 is equal to 1000 ns+10 ps=1 $\mu$s+0.00001 $\mu$s=1.00001 $\mu$s. From these figures, it will be apparent that when the equivalent sampling interval $\Delta t$ is equal to 10 ps, the frequency of the clock signal CLK1 is by nearly 10 Hz lower than the frequency F of the clock signal CLK having the period of nT.

Accordingly, if the clock generator 12 is caused to generate the clock signal CLK2 shown in FIG. 12D and having a frequency of 999890 Hz, which is slightly less, for example, by 100 Hz than the frequency 999990 Hz of the given clock signal LK1 shown in FIG. 12B and to supply it to the sampling head 11 until the trigger signal TR from the trigger circuit 14 is received, the sampling rate T2 in accordance with the clock signal CLK2 will be $\frac{1}{0.999890}$ MHz 1.000110012 $\mu$s. Consequently, the equivalent sampling interval $\Delta t$ will be equal to 1.000110012 $\mu$s–100 ns=0.000110012 $\mu$s 10 ps, and thus the equivalent sampling interval 110 ps of the clock signal CLK2 is eleven times the equivalent sampling interval 10 ps of the clock signal CLK1. After the trigger signal TR is received, the given clock signal CLK1 having the frequency of 999990 Hz is generated to download a waveform region for which a high accuracy is required into the digitizer 13. An example of the waveform of the low rate repeated signal LRS2 which is obtained by using the described equivalent sampling technique is shown in FIG. 13B, while FIG. 13A shows an example of the waveform of the high rate repeated signal HRS.

Since the equivalent sampling interval $\Delta t$ can be made longer as much as eleven times by merely lowering the frequency of the given clock signal CLK1 by only 100 Hz as described above, it will be seen that when the clock generator 12 is caused to generate the clock signal CLK2 of a frequency which is slightly less than the frequency of the given clock signal CLK1 until the trigger signal TR from the trigger circuit 14 is received and to supply it to the sampling head 11 so that the latter delivers a waveform data train a, b', c', . . . using a longer equivalent sampling interval Δt or having an increased time interval between samples (meaning a rough sampling), the low rate repeated signal LRS2 which is reproduced by synthesizing with a time interval corresponding to the equivalent sampling interval Δt will have a reduced number of data samples because of the longer equivalent sampling interval Δt until the trigger point Tr is reached, and the length of time required to download the waveform data into the digitizer section 13 and to synthesize it will be reduced. For example, if the equivalent sampling interval Δt is increased ten times longer, the length of time required to download the waveform data delivered from the sampling head 11 and to synthesize it will be reduced by a factor of about 10. Thus it will be seen that the length of time required to download a necessary waveform region LE into the digitizer section 13 will be greatly reduced if there is the waiting time WT which is equal to about $9/10$ times the period T3 of the low rate repeated signal LRS2 at maximum.

If the rising edge region LE has a time span of $1/10$, for example, with respect to the period T of the high rate repeated signal HRS, and $16 \times 10^3$ data items are downloaded into the digitizer section 13 within the time span of the rising edge region LE, a length of time equal to $16 \times 10^3 \times 10^{-6} (\mu s) =$ 16 ms will be required in the third embodiment in order to download data for the required rising edge region LE, in the similar manner as described above in connection with the prior art of FIG. 1, assuming a sampling rate of 1 μs. However, it is to be understood that when the equivalent sampling interval is increased 100 times longer, or if the frequency of the clock signal CLK2 is chosen to be about 900 Hz lower than the frequency of the clock signal CLK1, the maximum waiting time WT (=144 ms) will be reduced by a factor of 100 or to 1.44 ms. Thus, according to the third embodiment, a reduction of the maximum waiting time until the trigger point Tr is reached by a factor of 100 is greatly facilitated, thus providing an advantage that the efficiency of using the arrangement is greatly enhanced.

The requirement is that the clock signal CLK2 is lower in frequency than the clock signal CLK1, but in order to achieve the objective that the trigger point is reached within a reduced length of time, the equivalent sampling interval Δt2 by the clock signal CLK2 be chosen to be equal to or greater than twice the equivalent sampling interval Δt1 by the clock signal CLK1, and preferably equal to or greater than ten times, and may be chosen to be on the order of 1000 times as longer.

Fourth Embodiment

Figure 14:
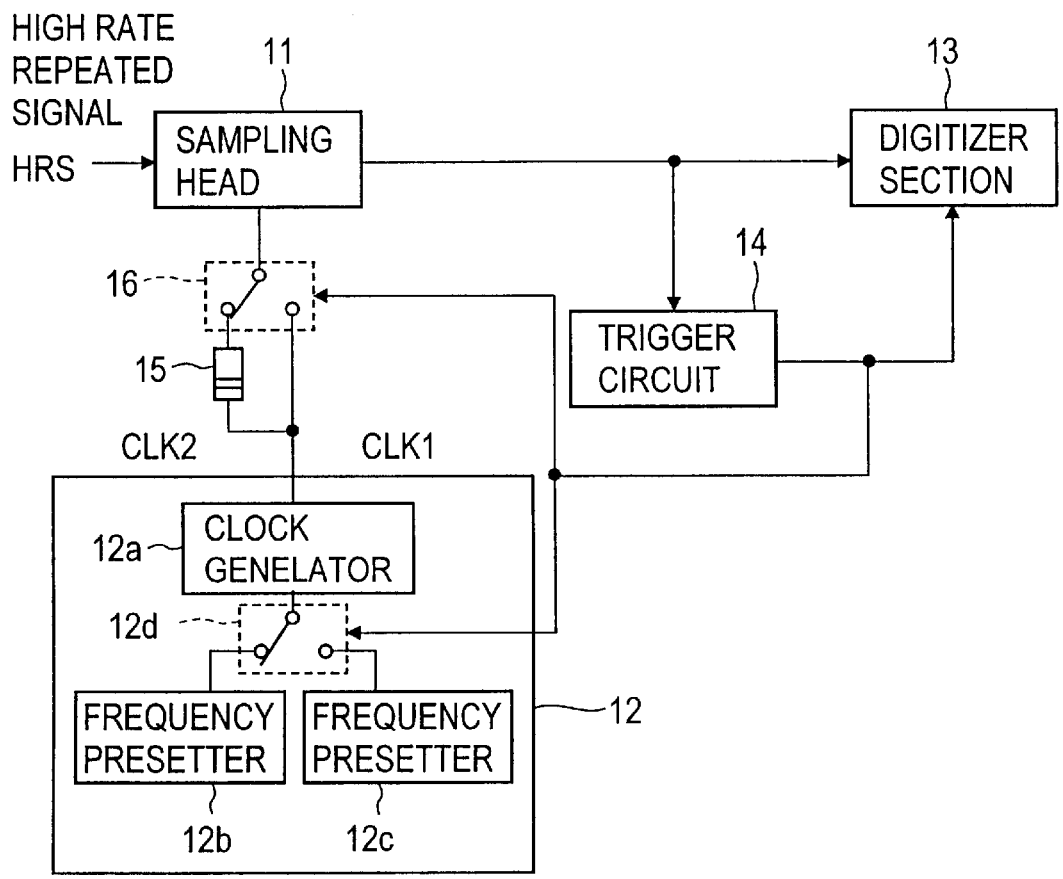
FIG. 14 is a block diagram of a fourth embodiment of the sampling digitizer according to the present invention.

FIG. 14 shows a fourth embodiment of the sampling digitizer according to the present invention, which is a combination of the first and the third embodiment. Parts corresponding to those shown in FIGS. 6 and 11 are designated by like reference numerals and characters as used before. A high rate repeated signal HRS is input to a sampling head 11, and a sampled output therefrom is supplied to a trigger circuit 14 and a digitizer section 13. When a trigger signal TR from the trigger circuit 14 is not detected, a clock generator 12 generates a clock signal CLK2, which is delayed as it is passed through a delay element 15 to be supplied as a clock signal CLK2d to the sampling head 11, thus allowing the high rate repeated signal HRS to be sampled with the clock signal CLK2d. When the trigger signal TR is delivered from the trigger circuit 14, it switches change-over switches 12d and 16, whereby the clock generator 12 delivers a clock signal CLK1, which is directly supplied to the sampling head 11 without being passed through the delay element 15.

The relationship between the clock signals CLK1 and CLK2 remains to be a similar relationship between frequencies thereof as mentioned above in connection with the third embodiment, and the amount of delay by the delay element 15 remains to be similar as mentioned above in connection with the first embodiment. Consequently, a trigger point is reached in a reduced length of time after sampling with the clock signal CLK2, and after the trigger point, the clock signal CLK1 provides sampled outputs having a reduced equivalent sampling interval, allowing a waveform of the high rate repeated signal HRS which precedes the trigger point to be downloaded into the digitizer section 13.

Fifth Embodiment

Figure 15:
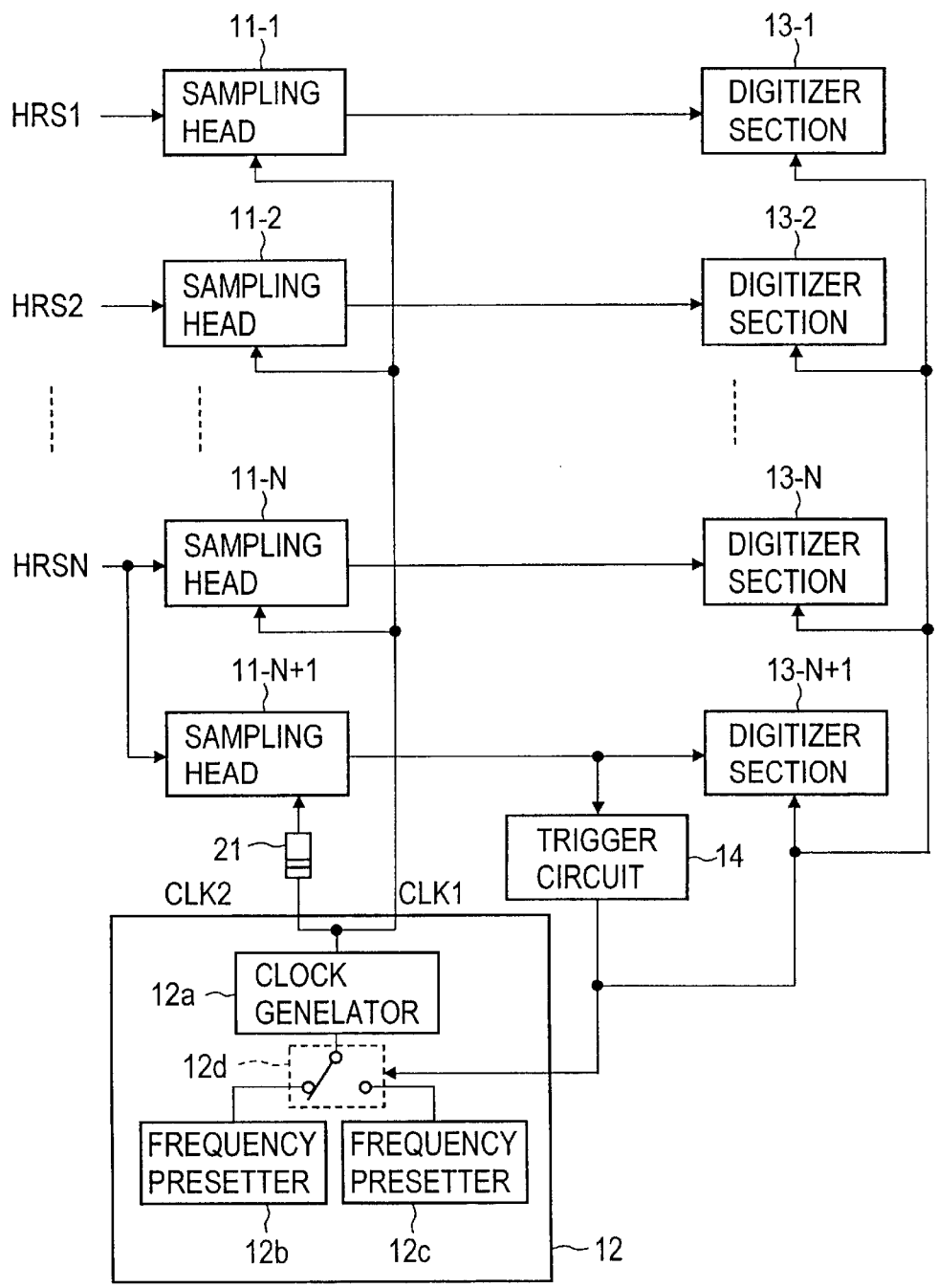
FIG. 15 is a block diagram of a fifth embodiment of the sampling digitizer according to the present invention.

FIG. 15 shows a fifth embodiment of the sampling digitizer according to the present invention, which is a combination of the second and the third embodiment. Parts corresponding to those shown in FIGS. 9 and 11 are designated by like reference numerals and characters as used before. In addition to a signal processing system comprising sampling heads and digitizer sections for the high rate repeated signals HRS1 to HRSN of N channels, there is provided a sampling head 11-N+1 as a trigger channel, to which one of the high rate repeated signals HRS1 to HRSN, which is HRSN in the example shown, is input. A sampled output from the sampling head 11-N+1 is supplied to a trigger circuit 14.

Before the trigger circuit 14 delivers a trigger signal, a clock generator 12 delivers a clock signal CLK2, which is passed through a delay element 21 to be supplied to the sampling head 11-N+1, thus allowing a sampling operation by the sampling head 11-N+1 using the clock signal CLK2. When the trigger circuit 14 delivers a trigger signal TR, the clock generator 12 delivers a clock signal CLK1, which is supplied to each of sampling heads 11-1 to 11-N without being passed through the delay element 21, allowing a sampling operation by the respective sampling heads 11-1 to 11-N using the clock signal CLK1. The trigger signal TR causes the downloading of sampled outputs into corresponding digitizer sections 13-1 to 13-N+1 to be initiated.

The frequency relationship between the clock signals CLK1 and LK2 remains similar to the relationship described above in connection with the third embodiment, and the amount of delay by the delay element 21 remains similar to that mentioned in connection with the second embodiment. Accordingly, the trigger point is reached within a reduced length of time, and digitizer sections 13-1 to 13-N can download waveforms of corresponding high rate signals beginning with a point in time which precedes a trigger point. It is to be understood that the digitizer section 13-N+1 may be omitted.

Method Embodiment

Figure 16:
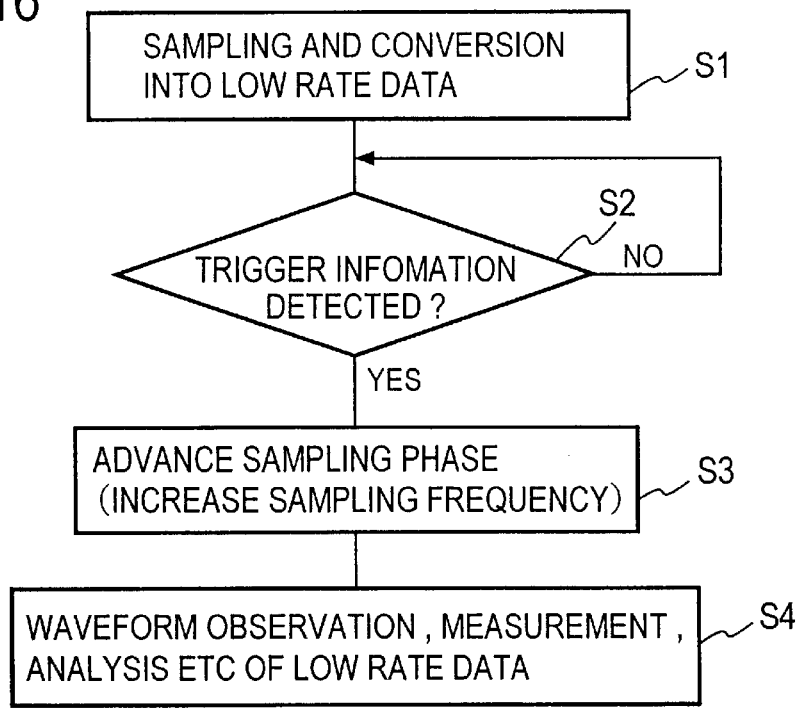
FIG. 16 is a flow chart of an embodiment of the method according to the present invention.

An embodiment of the method according to the present invention will be described. FIG. 16 corresponds to the first embodiment. Specifically, an input high rate repeated signal HRS is sampled with a lower frequency to be converted into a low rate data signal (S1). Then a coincidence of the low rate data signal with trigger information is waited for (S2), and upon coincidence, a sampling phase with respect to the high rate repeated signal HRS is advanced (S3). A waveform observation, measurement, analysis and the like is then performed with respect to a low rate data signal which is obtained by conversion on the basis of the phase advanced sampling (S4). The amount by which the sampling phase is advanced at step S3 corresponds to the amount of delay by the delay element 15 as mentioned above in connection with FIG. 6.

As indicated in parentheses at step S3, by increasing the sampling frequency, there is obtained an effect which corresponds to the third embodiment (FIG. 11). Thus, the sampling frequency corresponds to the frequency of the clock signal CLK2 in the third embodiment before the trigger is detected, and corresponds to the frequency of the clock signal CLK1 in the third embodiment after the detection of the trigger. This method embodiment corresponds to the fourth embodiment shown in FIG. 14.

Figure 17:
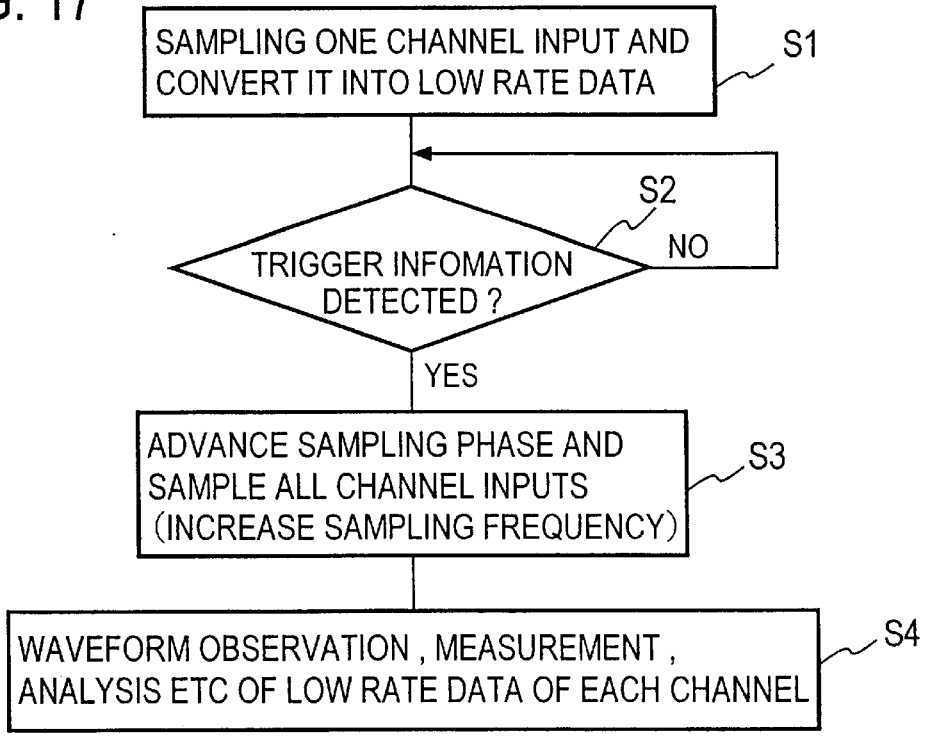
FIG. 17 is a flow chart of another embodiment of the method according to the present invention.

A method embodiment corresponding to the second embodiment will be described with reference to FIG. 17. Initially, a high rate repeated signal from one of a plurality of input channels, which may be a high rate repeated signal HRSN from N-th channel shown in FIG. 9, is sampled and converted into a low rate data signal (S1), a coincidence of the low rate data signal with trigger information is waited for (S2), and upon coincidence, input high rate repeated signals of all the channels are sampled at an advanced phase as compared with a sampling operation which takes place at step S1 and are converted into low rate data signals (S3). A waveform observation, measurement, analysis and the like take place with respect to these low rate data signals (S4). The amount of phase by which the sampling operation is advanced at step S3 corresponds to the amount of delay by the delay element 21 mentioned above in connection with FIG. 9.

As indicated in parentheses at step S3, when the sampling frequency is increased higher than the sampling frequency which is used at step S1, there results an arrangement which corresponds to the fifth embodiment shown in FIG. 15.

Figure 18:
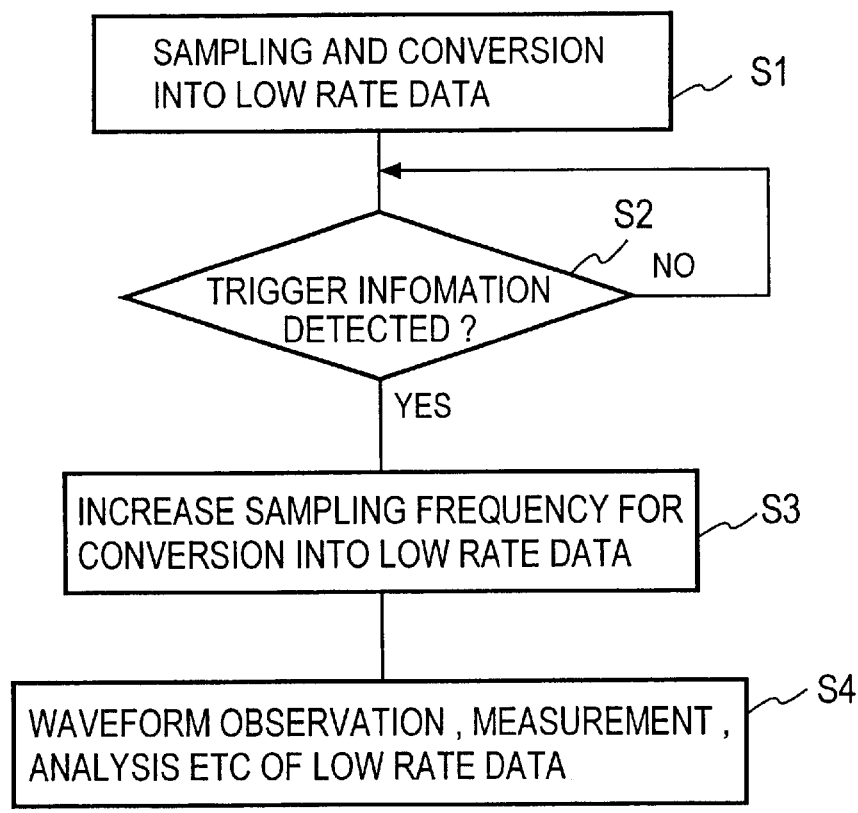
FIG. 18 is a flow chart of a further embodiment of the method according to the present invention.

FIG. 18 shows a method embodiment corresponding to the third embodiment (FIG. 11). A high rate repeated signal HRS is sampled and converted into a low rate data signal (S1), a coincidence of the low rate data signal with trigger information is waited for (S2), and upon coincidence, the sampling frequency is increased (S3). A waveform observation measurement, analysis and the like takes place with respect to the low rate data signal which is obtained by conversion on the basis of the sampling operation with the increased sampling frequency (S4). The sampling frequency used at step S1 corresponds to the frequency of the clock signal CLK2 in the third embodiment, and a sampling frequency which is used at step S3 corresponds to the frequency of the clock signal CLK1.

While in the above description, the sampling clock signal CLK1 has a period T1 which is equal to nT+Δt, it may be chosen to be equal to nT−Δt.

Figure 19:
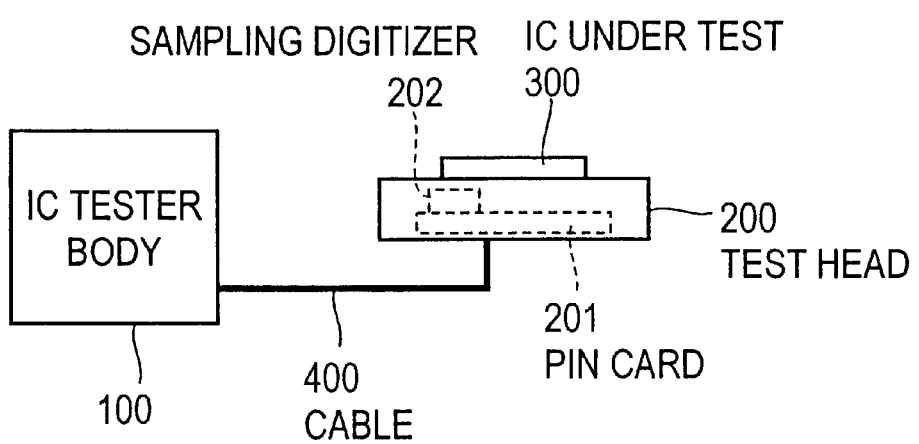
FIG. 19 is a block diagram of an embodiment of a semiconductor integrated circuit testing equipment according to the present invention.

When a sampling digitizer 202 which is illustrated in one of the first to the fifth embodiment is mounted on a pin card 201 contained within a test head 200 of an IC tester shown in FIG. 19, for example, it is possible to apply a test pattern signal to an IC under test 300 at a high rate, and to observe, measure and/or analyze the waveform of a high rate response signal delivered from each pin of the IC under test 300 with a high accuracy using the sampling digitizer 202. The observation, measurement, analysis and the like of the waveform allows a correct decision to be rendered whether the IC under test is acceptable or defective, allowing a test which classifies the operating speeds of the IC's under test into categories, for example, or a test which determines to which high rate signal the IC under test can positively respond to be executed, permitting a useful IC testing equipment to be provided. In addition, the testing time can be reduced.

It will be understood that an apparatus capable of functioning in a similar manner such as an oscilloscope may be used as a digitizer section which observes, measures and/or analyzes a signal waveform.

While the invention has been described above in connection with preferred embodiments shown in the drawings, it should be apparent to those skilled in the art that a number of changes, modifications and improvements can be made therein without departing from the spirit and scope of the present invention. Accordingly, it is intended that the present invention is not limited to the exact embodiments shown, but covers all of such changes, modifications and improvements coming within the scope of the present invention as defined by the appended claims.

It will be seen from the foregoing description that the present invention allows a required waveform region in an input high rate repeated signal to be acquired in a reduced length of time. According to the first aspect of the present invention, there is provided an advantage that a waveform region located across a trigger point can be observed, measured and/or analyzed in a reduced length of time without requiring an increased memory capacity.

What is claimed is:

1. A sampling digitizer comprising
a clock generator for generating a clock signal;
a sampler for sampling a high rate repeated signal which is input with the clock signal supplied from the clock generator to convert it into a low rate data signal;
a digitizer section adapted to be supplied with the low rate data signal from the sampler to perform a signal waveform observation, measurement or analysis;
a trigger circuit supplied with the low rate data signal from the sampler to generate a trigger signal when the data signal contains trigger information;
a delay unit for delaying the clock signal which is supplied from the clock generator to the sampler;
and a switch circuit for switching between the clock signal which is passed through the delay unit and a clock signal which is directly supplied from the clock generator to feed the sampler.

2. A sampling digitizer according to claim 1 in which the digitizer section begins to download the low rate data signal under the control of the trigger signal, the switch circuit being switchably controlled by the trigger signal to feed the clock signal which does not pass through the delay unit to the sampler.

3. A sampling digitizer according to claim 2 in which the delay unit has an amount of delay which is chosen to be greater than an equivalent sampling interval which is a quotient of a time interval corresponding to one period of the high rate repeated signal divided by the number of samples per period of the high rate repeated signal.

4. A sampling digitizer according to one of claims 1 to 3 in which the clock generator includes means responsive to the trigger signal to increase the frequency of a clock signal being generated.

5. A sampling digitizer according to claim 4, wherein the sampling digitizer is mounted on a pin card contained in a test head of semiconductor integrated circuit testing equipment.

6. A sampling digitizer comprising
a sampler provided for each channel for sampling a high rate repeated signal which is input thereto with a clock signal supplied thereto to convert it into a low rate data signal;
a digitizer section for receiving the low rate data signal from the sampler to perform a signal waveform observation, measurement or analysis;
a clock generator for generating a clock signal and feeding it to the sampler of each channel;
a delay unit to which the clock signal from the clock generator is supplied;

a trigger sampler for receiving the input high rate repeated signal from one of the channels and for sampling the input high rate repeated signal with the delayed clock signal from the delay unit to convert it into a low rate data signal;

and a trigger circuit for receiving the low rate data signal from the sampler and for generating a trigger signal whenever the low rate data signal contains trigger information to cause the digitizer section of each channel to download a corresponding low rate data signal.

7. A sampling digitizer according to claim 6 in which the delay unit has an amount of delay which is chosen to be greater than an equivalent sampling interval which is a quotient of a time interval corresponding to one period of the high rate repeated signal divided by the number of samples per period of the high rate repeated signal.

8. A sampling digitizer according to one of claims 1 to 7 in which the delay unit comprises a delay line.

9. A sampling digitizer according to claim 8, wherein the sampling digitizer is mounted on a pin card contained in a test head of semiconductor integrated circuit testing equipment.

10. A sampling digitizer according to one of claims 1 to 7 in which the delay unit comprises a counter delay unit.

11. A sampling digitizer according to claim 10, wherein the sampling digitizer is mounted on a pin card contained in a test head of semiconductor integrated circuit testing equipment.

12. A sampling digitizer according to one of claims 1 to 7 in which the delay unit comprises a phase shifter delay unit.

13. A sampling digitizer according to claim 12, wherein the sampling digitizer is mounted on a pin card contained in a test head of semiconductor integrated circuit testing equipment.

14. A sampling digitizer according to any one of claims 1 to 7, wherein the sampling digitizer is mounted on a pin card contained in a test head of semiconductor integrated circuit testing equipment.

15. A sampling digitizer comprising a clock generator for generating a clock signal;

a sampler for sampling a high rate repeated signal which is input thereto with a clock signal supplied from the clock generator to convert it into a low rate data signal;

a digitizer section for receiving the low rate data signal from the sampler to perform a signal waveform observation, measurement or analysis;

a trigger circuit for receiving the low rate data signal from the sampler and for generating a trigger signal whenever the data signal contains trigger information;

and means provided in the clock generator for changing the frequency of the clock signal being generated to a higher value while maintaining the continuity of the phase.

16. A sampling digitizer according to claim 15, wherein the sampling digitizer is mounted on a pin card contained in a test head of semiconductor integrated circuit testing equipment.

17. A sampling digitizing method comprising the steps of sampling a high rate repeated signal which is input and converting it into a low rate data signal;

detecting a coincidence between the low rate data signal and trigger information;

advancing the phase of the sampling by a given amount and performing a signal waveform observation, measurement or analysis upon the low rate data signal which is obtained subsequent to advancing the sampling phase.

18. A sampling digitizing method according to claim 17, further comprising the step of increasing the frequency simultaneously as advancing the phase of the sampling.

19. A sampling digitizing method comprising the steps of sampling a high rate repeated signal in one of a plurality of channels to convert it into a low rate data signal;

detecting any coincidence between the low rate data signal and trigger information;

advancing the phase of the sampling to sample high rate repeated signals in the plurality of channels to convert them into corresponding low rate data signals;

and performing waveform observation, measurement, analysis and the like upon these low rate data signals.

20. A sampling digitizing method according to claim 19 in which the step of converting high rate repeated signals in the plurality of channels into corresponding low rate data signals is performed by using a sampling frequency which is chosen to be higher than the sampling frequency with which the high rate repeated signal in said one of the plurality of channels is sampled.

21. A sampling digitizing method comprising the steps of sampling a high rate repeated signal which is input to convert it into a low rate data signal;

detecting any coincidence between the low rate data signal and trigger information;

increasing the sampling frequency;

and performing a waveform observation, measurement, analysis and the like upon a low rate data signal which is converted by the sampling with the increased frequency.

* * * * *

UNITED STATES PATENT AND TRADEMARK OFFICE
CERTIFICATE OF CORRECTION

PATENT NO. : 6,751,566 B2
DATED : June 15, 2004
INVENTOR(S) : Masao Sugai

It is certified that error appears in the above-identified patent and that said Letters Patent is hereby corrected as shown below:

<u>Title page</u>,
Item [30], Foreign Application Priority Data, "2000-265691" should be -- 2000-165691 --

Signed and Sealed this

Thirty-first Day of August, 2004

JON W. DUDAS
*Director of the United States Patent and Trademark Office*